(12) United States Patent
Ueno et al.

(10) Patent No.: US 9,391,277 B2
(45) Date of Patent: *Jul. 12, 2016

(54) DEVICE COMPRISING POSITIVE HOLE INJECTION TRANSPORT LAYER, METHOD FOR PRODUCING THE SAME AND INK FOR FORMING POSITIVE HOLE INJECTION TRANSPORT LAYER

(75) Inventors: Shigehiro Ueno, Tokyo-to (JP); Masato Okada, Tokyo-to (JP); Shinsuke Nagino, Tokyo-to (JP); Keisuke Hashimoto, Tokyo-to (JP)

(73) Assignee: DAI NIPPON PRINTING CO., LTD., Tokyo-to (JP)

( * ) Notice: Subject to any disclaimer, the term of this patent is extended or adjusted under 35 U.S.C. 154(b) by 1191 days.

This patent is subject to a terminal disclaimer.

(21) Appl. No.: 13/389,647

(22) PCT Filed: Oct. 27, 2010

(86) PCT No.: PCT/JP2010/069090
§ 371 (c)(1),
(2), (4) Date: Feb. 9, 2012

(87) PCT Pub. No.: WO2011/052648
PCT Pub. Date: May 5, 2011

(65) Prior Publication Data
US 2012/0138916 A1 Jun. 7, 2012

(30) Foreign Application Priority Data
Oct. 27, 2009 (JP) ................. 2009-246883

(51) Int. Cl.
| | | |
|---|---|---|
| *H01L 51/54* | (2006.01) | |
| *H01L 51/00* | (2006.01) | |
| *H05B 33/10* | (2006.01) | |
| *H01L 51/05* | (2006.01) | |
| *H01L 51/50* | (2006.01) | |

(52) U.S. Cl.
CPC ........ *H01L 51/0043* (2013.01); *H01L 51/0039* (2013.01); *H01L 51/0084* (2013.01); *H05B 33/10* (2013.01); *H01L 51/0545* (2013.01); *H01L 51/5048* (2013.01); *H01L 51/5088* (2013.01)

(58) Field of Classification Search
CPC .............. H01L 51/5048; H01L 51/506; H01L 51/5064; H01L 51/5088; H01L 51/0051
See application file for complete search history.

(56) References Cited

U.S. PATENT DOCUMENTS

| 9,105,859 | B2* | 8/2015 | Ueno ................. H01L 51/5048 |
|---|---|---|---|
| 2006/0182993 | A1 | 8/2006 | Ogata et al. |
| 2007/0262693 | A1 | 11/2007 | Seo et al. |
| 2011/0037065 | A1 | 2/2011 | Ueno et al. |
| 2011/0163327 | A1 | 7/2011 | Ueno et al. |

FOREIGN PATENT DOCUMENTS

| CN | 102017217 B | 3/2013 |
|---|---|---|
| JP | 09-063771 A | 3/1997 |
| JP | 11-283750 A | 10/1999 |
| JP | 2000-036390 A | 2/2000 |
| JP | 2002-204012 A | 7/2002 |
| JP | 2005-093427 A | 4/2005 |
| JP | 2006-114521 A | 4/2006 |
| JP | 2006-155978 A | 6/2006 |
| JP | 2006-156981 A | 6/2006 |
| JP | 2007-287586 A | 11/2007 |
| JP | 2007-294261 A | 11/2007 |
| JP | 2008-041894 A | 2/2008 |
| WO | 2008/061518 A2 | 5/2008 |
| WO | 2009/133903 A1 | 11/2009 |

OTHER PUBLICATIONS

Tsunenori Suzuki, et al; "69.3: Polymer/Metal-Oxide Comosite: A Novel Buffer Layer for Solution-Processible OLEDs", SID Symposium Digest of Technical Papers, May 2007, vol. 38, Issue 1, pp. 1840-1843.
International Search Report: mailed Dec. 7, 2010; PCT/JP2010/069090.

* cited by examiner

*Primary Examiner* — Andrew K Bohaty
(74) *Attorney, Agent, or Firm* — Ladas & Parry LLP

(57) ABSTRACT

A device including a substrate, two or more electrodes facing each other disposed on the substrate and a positive hole injection transport layer disposed between two electrodes among the two or more electrodes, wherein the positive hole injection transport layer contains a reaction product of a transition metal complex or complexes, and wherein at least one or more kinds of transition metals selected from the group consisting of vanadium, rhenium and platinum, or a mixture of molybdenum and one or more kinds of transition metals selected from the group consisting of vanadium, rhenium and platinum is contained in a central metal or metals of the transition metal complex or complexes.

12 Claims, 2 Drawing Sheets

DEVICE COMPRISING POSITIVE HOLE INJECTION TRANSPORT LAYER, METHOD FOR PRODUCING THE SAME AND INK FOR FORMING POSITIVE HOLE INJECTION TRANSPORT LAYER

TECHNICAL FIELD

The present invention relates to a device comprising a positive hole injection transport layer including an organic device such as an organic electroluminescent element, and a quantum dot light emitting element, a method for producing the same, and an ink for forming the positive hole injection transport layer.

BACKGROUND ART

It is expected that a device using an organic substance develops to a wide range of elementary elements such as an organic electroluminescent element (hereinafter referred to as an organic EL element), an organic transistor, an organic solar battery, and an organic semiconductor and uses. In addition to the above devices, devices having a positive hole injection transport layer include a quantum dot light emitting element, an oxide compound solar battery, etc.

An organic EL element is a charge injection type self light emitting device, utilizing the light emission generated at the time of recombining an electron and a positive hole reaching at a light emitting layer. Such an organic EL element has been developed actively since 1987 when T. W. Tang, et al. proved that an element comprising laminated thin films of a fluorescent metal chelate complex and a diamine based molecule emits light of high luminance with a low driving voltage.

The element configuration of the organic EL element comprises a cathode/an organic layer/an anode. The organic layer in an initial organic EL element has a two layer structure comprising a light emitting layer and a positive hole injection layer. At present, however, in order to obtain a high light emitting efficiency and a long driving lifetime, various multilayered structures such as a five layer structure comprising an electron injection layer/an electron transport layer/a light emitting layer/a positive hole transport layer/a positive hole injection layer, etc. have been proposed.

It is said that the layers other than the light emitting layer including the electron injection layer, the electron transport layer, the positive hole transport layer and the positive hole injection layer have effects that charges are easily injected and transported to the light emitting layer, the balance between an electronic current and a positive hole current is maintained by blocking charges, and the diffusion of a light energy exciton is prevented.

For the purpose of improving charge transport ability and charge injection ability, there has been attempts to increase electric conductivity by mixing an oxidizing compound to a positive hole transport material (Patent Literatures 1 and 2).

In Patent Literature 1, as the oxidizing compound, that is, an electron accepting compound, a compound containing counter anions such as a triphenylamine derivative and antimony hexafluoride, and a compound having a significantly-high electron-accepting property, in which a cyano group is bonded to carbon of a carbon-carbon double bond, such as 7,7,8,8-tetracyanoquinodimethane, are used.

In Patent Literature 2, as an oxidizing dopant, a general oxidant can be exemplified, and also halogenated metal, Lewis acid, organic acid and salt of arylamine and halogenated metal or Lewis acid can be exemplified.

In Patent Literatures 3 to 6, as the oxidizing compound, that is, the electron accepting compound, a metal oxide being a compound semiconductor is used. For the purpose of obtaining a positive hole injection layer having an excellent injection property and charge transfer property, for example, a thin film is formed by a vapor deposition method using a metal oxide such as vanadium pentoxide or molybdenum trioxide, or a mixed film is formed by codeposition of a molybdenum oxide and an amine based low molecular weight compound.

In Patent Literature 7, a solution, in which oxovanadium (V)tri-1-propoxideoxide is dissolved as the oxidizing compound, that is, the electron accepting compound, is used. Patent Literature 7 discloses a method for forming a charge transfer complex comprising the step of forming a mixed coating film of the solution and a positive hole transport polymer followed by hydrolysis in water vapor to obtain vanadium oxide.

Patent Literature 8 discloses that an organic EL element having a long lifetime is produced by dispersing particles produced by physically pulverizing molybdenum trioxide in a solution to produce a slurry, and applying the slurry to form a positive hole injection layer, as an attempt to form a coating film of molybdenum trioxide.

On the other hand, an organic transistor is a thin film transistor using an organic semiconductor material comprising an organic polymer or an organic low-molecular compound having a π conjugated system for a channel area. A general organic transistor comprises a substrate, a gate electrode, a gate insulating layer, source and drain electrodes and an organic semiconductor layer. In the organic transistor, by changing a voltage (gate voltage) applied to the gate electrode, a quantity of electric charge of an interface of a gate insulating layer and an organic semiconductor layer is controlled and switching is performed by changing a current value between a source electrode and a drain electrode.

As an attempt to improve an on-current value of the organic transistor and stabilize element characteristic by lowering a charge injection barrier between the organic semiconductor layer and the source electrode or the drain electrode, it is known that the carrier density in the organic semiconductor layer in the vicinity of the electrode is increased by introducing the charge transfer complex to an organic semiconductor (for example, Patent Literature 9).

CITATION LIST

Patent Literature

[Patent Literature 1] Japanese Patent Application Laid-Open (JP-A) No. 2000-36390
[Patent Literature 2] JP-A No. H11-283750
[Patent Literature 3] JP-A No. 2006-155978
[Patent Literature 4] JP-A No. 2007-287586
[Patent Literature 5] Japanese patent No. 3748110
[Patent Literature 6] JP-A No. H9-63771
[Patent Literature 7] SID 07 DIGEST pp. 1,840 to 1,843 (2007)
[Patent Literature 8] JP-A No. 2008-041894
[Patent Literature 9] JP-A No. 2002-204012

SUMMARY OF INVENTION

Technical Problem

However, even if any of oxidizing materials as disclosed in Patent Literatures 1 to 9 is used as a positive hole transport material, an element having a long lifetime is hardly realized, or the lifetime needs to be further extended. The reason thereof is presumed that oxidizing materials disclosed in Patent Literatures 1, 2, and 9 have a low oxidizing ability toward the positive hole transport material, or low dispersing stability in a thin film. For example, in the case that an oxidizing material comprising a cationic triphenylamine derivative and antimony hexafluoride used in both Patent Literature 1 and Patent Literature 2 is mixed with the positive hole transport material, a charge transfer complex is produced, while the same number of free antimony hexafluoride being a counter anion type as the charge transfer complex is present in a thin film. It is assumed that the free antimony hexafluoride migrates upon driving so that materials partially aggregate and precipitate at the interface with an adjacent layer, thus, the dispersing stability of the material in the thin film upon driving decreases. It is considered that such a change of dispersing stability upon driving changes a carrier injection or transport in the element, therefore, it has an adverse effect on lifetime property. In addition, it is considered that metal oxides disclosed in Patent Literatures 3 to 5 improve positive hole injection property, however, it makes the adhesion of the interface to an adjacent organic compound layer insufficient, thus, the metal oxide has an adverse effect on lifetime property.

In addition, there is a problem that the oxidizing materials as disclosed in Patent Literatures 1 to 9 lack versatility since it has insufficient solvent solubility of dissolving at the same time as a positive hole transport polymer compound used to form a film by a solution applying method so that only the oxidizing materials aggregate, and the types of usable solvents are limited. Particularly for a molybdenum oxide being an inorganic compound, there is a problem that although it has a relatively-high property, it is insoluble in a solvent, therefore, the solution applying method cannot be used. For example, Patent Literature 7 discloses a method for forming a charge transfer complex as a vanadium oxide by forming a mixed coating film of an oxovanadium (V) tri-1-propoxide oxide and a positive hole transport polymer followed by hydrolysis in water vapor. However, in Patent Literature 7, the oxovanadium(V)tri-1-propoxide oxide solidifies by a hydrolytic polycondensation reaction, thus, vanadium easily aggregates and film property is hardly controlled, therefore, an excellent film is hardly obtained. In addition, since a coating film cannot be formed only of the oxovanadium (V) tri-1-propoxide oxide, it is mixed with the positive hole transport polymer, therefore, the organic component concentration of the coating film of Patent Literature 7 is naturally high and the vanadium concentration, which is considered as an active component for a lifetime of an element, is insufficient. As described above, in Patent Literature 7, further improvement in the lifetime property and the element characteristics are required. In addition, Patent Literature 8 discloses that a charge injection layer is produced by a screen printing method using a slurry in which molybdenum oxide particles having an average particle diameter of 20 nm are dispersed in a solvent. However, it is in fact significantly difficult, for example, to produce particles having a uniform particle diameter on a scale of 10 nm or less to satisfy the request for forming a positive hole injection layer having a thickness of about 10 nm by the method of pulverizing $MoO_3$ powder as described in Patent Literature 8. In addition, it is more difficult to stably disperse molybdenum oxide particles produced by pulverization in a solution without aggregation. If the particles are unstably dispersed in a solution, only a film having an unevenness with large difference in height and a poor smoothness can be formed upon forming a coating film, thus, it can cause short circuit of a device. In the case that a thin film can be only formed by a vapor deposition method, there has been a problem of not being able to take advantage of the solution applying method, even if a light emitting layer is formed by separately applying materials by the solution applying method such as an ink-jet method. That is, to avoid impairing liquid repellency of bulkhead (bank) between the light emitting layers by a molybdenum oxide having lyophilicity, the positive hole injection layer or the positive hole transport layer containing the molybdenum oxide being the inorganic compound is required to be deposited using a very fine mask, and it cannot take advantage of the solution applying method from the viewpoint of cost and yield. Further, the molybdenum oxide being the inorganic compound is an oxygen defect type oxide semiconductor, and as for the electric conductivity, $Mo_2O_5$ having an oxidation number of +5 is a better conductor than $MoO_3$ having an oxidation number of +6 at ordinary temperature, however, it is unstable in the air. Therefore, the compound which can be easily deposited by heating is limited to an oxidized compound having a stable valence such as $MoO_3$ or $MoO_2$.

The film-forming property and the stability of the thin film strongly influence the lifetime property of an element. Generally, the lifetime of an organic EL element is defined as the time in which luminance decreases by half when continuous driving at a constant current, and the longer the time in which luminance decreases by half of the element is, the longer the driving lifetime of the element is.

The present invention has been achieved in view of the above problems. A main object of the present invention is to provide a device capable of forming a positive hole injection transport layer by a solution applying method, thus having an easy production process, and capable of achieving a long lifetime.

Solution to Problem

As a result of diligent researches, the inventors of the present invention has found out that by using a transition metal complex or complexes having a specific transition metal or metals as a central metal or metals for a positive hole injection transport layer to produce a reaction product of the transition metal complex or complexes, the positive hole injection transport layer becomes a film having a high stability, which is capable of forming a charge transfer complex, thus improving positive hole injection property, and has an excellent adhesion to an adjacent electrode or organic layer, and the inventors has reached the present invention.

That is, a device of the present invention comprises a substrate, two or more electrodes facing each other disposed on the substrate and a positive hole injection transport layer disposed between two electrodes among the two or more electrodes, wherein the positive hole injection transport layer contains a reaction product of a transition metal complex or complexes, and wherein at least one or more kinds of transition metals selected from the group consisting of vanadium, rhenium and platinum, or a mixture of molybdenum and one or more kinds of transition metals selected from the group consisting of vanadium, rhenium and platinum is contained in a central metal or metals of the transition metal complex or complexes.

Unlike a metal oxide being an inorganic compound, the reaction product of the transition metal complex or complexes having a specific transition metal or metals as a central metal or metals used for the device of the present invention can control charge injection property and charge transport property by the valence of the metal or metals and a ligand or ligands. In addition, unlike the metal oxide being the inorganic compound, the transition metal complex or complexes can contain an organic part in the ligand, thus, the compatibility with a positive hole transport compound being an organic substance, and the adhesion of an interface to an adjacent organic layer become excellent. Furthermore, it can be considered that the transition metal complex or complexes have higher reactivity than conventionally used metal complexes such as copper phthalocyanine, thus, the reaction product of the transition metal complex or complexes can easily form a charge transfer complex or complexes. Therefore, the device of the present invention comprising the positive hole injection transport layer containing the reaction product of the transition metal complex or complexes can achieve low voltage driving, high power efficiency and long lifetime.

In addition, by selecting the type of the ligand or ligands of the transition metal complex or complexes or modifying the ligand or ligands, it is easy to multifunctionalize the device of the present invention, including imparting functionalities such as solvent solubility, hydrophilicity/hydrophobicity, charge transport property and adhesion property.

The transition metal complex or complexes used for the positive hole injection transport layer of the device of the present invention can be easily synthesized with a small number of synthesizing steps by being appropriately selected, therefore, a device having a high efficiency can be produced at a low cost.

Most of the transition metal complexes used for the device of the present invention have solvent solubility or high compatibility with the positive hole transport compound being used together. In this case, a thin film can be formed by the solution applying method; therefore, the production process has many advantages. In such a case of using the solution applying method, the transition metal complex or complexes are less likely to aggregate similarly as a pigment, for example, and have high stability in the solution; therefore, there is an advantage that the yield is high. In addition, in the case of forming the positive hole injection transport layer by the solution applying method, the positive hole injection transport layer to the light emitting layer can be sequentially formed on a substrate having a liquid-repellent bank only by a coating process. Therefore, there is such an advantage that the device can be produced by a simpler process and at a lower cost compared with a process of, as in the case of a metal oxide being an inorganic compound, depositing a positive hole injection layer by vapor deposition using a very fine mask or the like, forming a positive hole transport layer and a light emitting layer by a solution applying method, and then further depositing a second electrode.

In the device of the present invention, from the viewpoint of lowering driving voltage and extending an element lifetime, it is preferable that the reaction product of the transition metal complex or complexes are a transition metal oxide or oxides produced by a reaction of the transition metal complex or complexes and an organic solvent having a carbonyl group and/or hydroxyl group.

In the device of the present invention, from the viewpoint of lowering driving voltage and further extending the element lifetime, it is preferable that the positive hole injection transport layer contains at least the reaction product of the transition metal complex or complexes and a positive hole transport compound.

In the device of the present invention, the positive hole injection transport layer may comprise a layer in which at least a layer containing the reaction product of the transition metal complex or complexes and a layer containing the positive hole transport compound are laminated.

In the device of the present invention, the positive hole injection transport layer may comprise a layer in which at least a layer containing the reaction product of the transition metal complex or complexes and a layer at least containing the reaction product of the transition metal complex or complexes and the positive hole transport compound are laminated.

In the device of the present invention, from the viewpoint of lowering driving voltage and further extending the element lifetime, it is preferable that the positive hole transport compound is a positive hole transport polymer compound.

The device of the present invention is suitably used for an organic EL element containing an organic layer at least having a light emitting layer.

A method for producing the device of the present invention is a method for producing a device comprising a substrate, two or more electrodes facing each other disposed on the substrate and a positive hole injection transport layer disposed between two electrodes among the two or more electrodes, the method comprising: a preparation step of preparing an ink for forming the positive hole injection transport layer, containing an organic solvent having a carbonyl group and/or hydroxyl group and a transition metal complex or complexes in which at least one or more kinds of transition metals selected from the group consisting of vanadium, rhenium and platinum or a mixture of molybdenum and one or more kinds of transition metals selected from the group consisting of vanadium, rhenium and platinum is contained in a central metal or metals of the transition metal complex or complexes; a formation step of forming the positive hole injection transport layer on any of layers on the electrodes using the ink for forming the positive hole injection transport layer; and an oxidation step of at least partially oxidizing the transition metal complex or complexes to produce a transition metal oxide or oxides.

According to the method for producing the device of the present invention, it is possible to provide a device capable of forming the positive hole injection transport layer by the solution applying method, thus having an easy production process, and capable of achieving the long lifetime.

In the method for producing the device of the present invention, the oxidation step may be performed after preparing the ink for forming the positive hole injection transport layer before or after forming the positive hole injection transport layer.

That is, one embodiment of the method for producing the device of the present invention comprises the formation step of forming the positive hole injection transport layer containing the transition metal complex or complexes on any of the layers on the electrodes and the oxidation step of at least partially oxidizing the transition metal complex or complexes in the positive hole injection transport layer to produce the transition metal oxide or oxides.

Another embodiment of the method for producing the device of the present invention comprises the oxidation step being performed after preparing the ink for forming the positive hole injection transport layer before forming the positive hole injection transport layer so that the formation step is forming the positive hole injection transport layer containing the transition metal oxide or oxides on any of layers on the electrodes using the oxidized ink for forming the positive hole injection transport layer.

In the method for producing the device of the present invention, a heating process and/or a light irradiation process and/or a process of using active oxygen can be used as the oxidation step.

The ink for forming the positive hole injection transport layer of the present invention comprises an organic solvent having a carbonyl group and/or hydroxyl group and a transition metal complex or complexes in which at least one or more kinds of transition metals selected from the group consisting of vanadium, rhenium and platinum or a mixture of molybdenum and one or more kinds of transition metals selected from the group consisting of vanadium, rhenium and platinum is contained in a central metal or metals of the transition metal complex or complexes.

In the ink for forming the positive hole injection transport layer of the present invention, from the viewpoint of lowering driving voltage and further extending the element lifetime, it is preferable that the ink comprises a transition metal oxide or oxides produced by a reaction of the organic solvent having the carbonyl group and/or hydroxyl group and the transition metal complex or complexes.

Advantageous Effects of Invention

The device of the present invention is capable of having an easy production process and achieving a long lifetime.

According to the method for producing the device of the present invention, it is possible to provide a device capable of having an easy production process and achieving a long lifetime.

In addition, according to the ink for forming the positive hole injection transport layer of the present invention, it is possible to provide a device capable of having an easy production process and achieving a long lifetime.

DESCRIPTION OF EMBODIMENTS

1. Device

Figure 1:
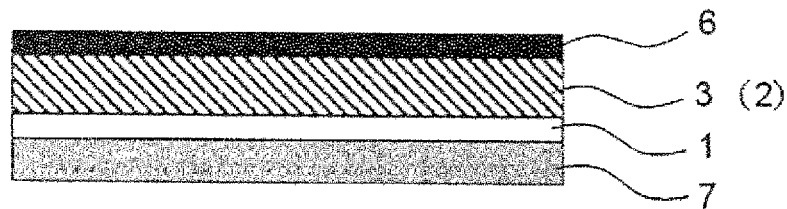
FIG. 1 is a sectional schematic diagram showing a basic constitution of layers of the device of the present invention.

A device of the present invention comprises a substrate, two or more electrodes facing each other disposed on the substrate and a positive hole injection transport layer disposed between two electrodes among the two or more electrodes, wherein the positive hole injection transport layer contains a reaction product of a transition metal complex or complexes, and wherein at least one or more kinds of transition metals selected from the group consisting of vanadium, rhenium and platinum, or a mixture of molybdenum and one or more kinds of transition metals selected from the group consisting of vanadium, rhenium and platinum is contained in a central metal or metals of the transition metal complex or complexes.

The device of the present invention can achieve a long lifetime of an element since the positive hole injection transport layer can be a film having a high stability, which is capable of forming a charge transfer complex or complexes, thus improving positive hole injection property, and has an excellent adhesion to an adjacent electrode or organic layer by containing the reaction product of the transition metal complex or complexes having a specific transition metal or metals as a central metal or metals. In addition, the positive hole injection transport layer can be formed using a solution applying method. In this case, it is possible to have an easy production process and achieve the long lifetime.

The reason why the reaction product of the transition metal complex or complexes used for the device of the present invention can extend the lifetime, as described above, is assumed as below. That is, the transition metal complex or complexes have high reactivity, and can form the reaction product by the reaction thereof or therebetween, for example, through a redox reaction with an organic solvent used when a layer is formed by the solution applying method. It can be assumed that since the reaction product of the transition metal complex or complexes can easily form a charge transfer complex or complexes with the positive hole transport compound or the reaction product of the complex or complexes, the charge injection transport ability of the positive hole injection transport layer can be efficiently improved, thus, the lifetime can be extended. In addition, unlike an oxide being an inorganic compound, the reaction product of the complex or complexes can control charge injection property and charge transport property by a ligand or ligands and the valence of the metal or metals. Accordingly, in the present invention, it is possible to improve the charge injection transport ability of the positive hole injection transporting efficiently. In addition, unlike a metal oxide being an inorganic compound, the transition metal complex or complexes can contain an organic part in the ligand, thus, the compatibility with a positive hole transport compound being an organic substance, and the adhesion of an interface to an adjacent organic layer become excellent. It can be assumed that, therefore, the device of the present invention comprising the positive hole injection transport layer containing the reaction product of the transition metal complex or complexes can achieve low voltage driving, high power efficiency and, particularly, long lifetime.

In addition, in the device of the present invention, by selecting the type of the ligand or ligands of the transition metal complex or complexes or modifying the ligand or ligands, it is easy to multifunctionalize the device of the present invention, including imparting functionalities such as solvent solubility, hydrophilicity/hydrophobicity, charge transport property and adhesion property.

The transition metal complex or complexes used for the positive hole injection transport layer of the device of the present invention can be easily synthesized with a small number of synthesizing steps by being appropriately selected, therefore, a device having a high efficiency can be produced at a low cost.

Most of the transition metal complexes used for the device of the present invention have solvent solubility or high compatibility with the positive hole transport compound being used together. In this case, a thin film can be formed by the solution applying method; therefore, the production process has many advantages. In such a case of using the solution applying method, the transition metal complex or complexes are less likely to aggregate similarly as metal nanoparticles or a pigment, for example, and have high stability in the solution; therefore, there is an advantage that the yield is high. In addition, in the case of forming the positive hole injection transport layer by the solution applying method, the positive hole injection transport layer to the light emitting layer can be sequentially formed on a substrate having a liquid-repellent bank only by a coating process. Therefore, there is such an advantage that the device can be produced by a simpler process and at a lower cost compared with a process of, as in the case of a metal oxide being an inorganic compound, depositing a positive hole injection layer by vapor deposition using a very fine mask or the like, forming a positive hole transport layer and a light emitting layer by a solution applying method, and then further depositing a second electrode.

The fact that the charge transfer complex or complexes are formed by the reaction product of the transition metal complex or complexes, can be suggested by the phenomenon observed by the 1H NMR measurement, for example, in which the shape of proton signal and a chemical shift value derived from the aromatic ring observed around 6 to 10 ppm regarding a charge transport compound change after the transition metal complex or complexes are mixed with a solution of the charge transport compound compared with those before the transition metal complex or complexes are mixed with the solution of the charge transport compound.

Hereinafter, a constitution of layers of the device of the present invention will be described.

The device of the present invention comprises a substrate, two or more electrodes facing each other disposed on the substrate and a positive hole injection transport layer disposed between two electrodes among the two or more electrodes.

The device of the present invention includes organic devices such as an organic EL element, an organic transistor, a dye-sensitized solar battery, an organic thin film solar battery, and an organic semiconductor, and even includes a quantum dot light emitting element and an oxide compound solar battery having the positive hole injection transport layer.

FIG. 1 is a sectional schematic diagram showing a basic constitution of layers of the organic device of the present invention. The basic constitution of layers of the device of the present invention comprises two electrodes (1 and 6) facing each other disposed on a substrate 7, and an organic layer 3 containing at least a positive hole injection transport layer 2 disposed between the two electrodes (1 and 6).

The substrate 7 is a support medium for forming layers constituting the device. It is not required for the substrate 7 to be disposed on the surface of the electrode 1, and may be disposed on the outermost surface of the device.

The positive hole injection transport layer 2 is a layer containing at least the reaction product of the transition metal complex or complexes and performing a function of injecting and/or transporting a positive hole from the electrode 1 to the organic layer 3.

The organic layer 3 is a layer which exhibits various functions depending on a type of the device by injecting and transporting the positive hole, and may comprise a single layer or two or more layers. In the case that the organic layer comprises two or more layers, the organic layer contains the positive hole injection transport layer, and further contains a layer which plays a central role in the function of the device (hereinafter, it will be referred to as a functional layer), and a layer which plays a supplementary role of the functional layer (hereinafter, it will be referred to as a supplementary layer). For example, in the case of the organic EL element, the positive hole transport layer further laminated on the surface of the positive hole injection transport layer corresponds to the supplementary layer, and the light emitting layer laminated on the surface of the positive hole transport layer corresponds to the functional layer.

The electrode 6 is disposed in a position where the organic layer 3 containing the positive hole injection transport layer 2 exists between the electrode 6 and the electrode 1 facing each other. In addition, if necessary, the device may have a third electrode, which is not shown in the figures. By applying an electric field to layers between the electrodes, the function of the device can be exhibited.

Figure 2:
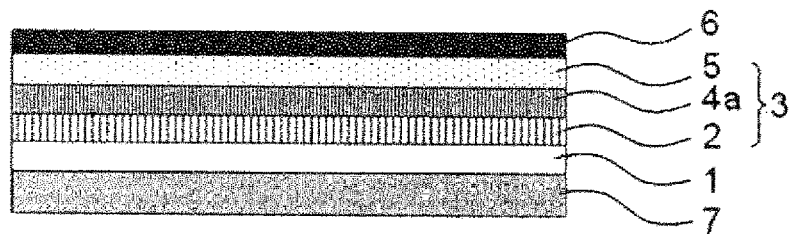
FIG. 2 is a schematic sectional view showing an example of a constitution of layers of the organic EL element being one embodiment of the device of the present invention.

FIG. 2 is a schematic sectional view showing an example of the constitution of layers of the organic EL element being one embodiment of the device of the present invention. The organic EL element of the present invention has an embodiment in which the positive hole injection transport layer 2 is laminated on the surface of the electrode 1, and the positive hole transport layer 4a and the light emitting layer 5 are laminated on the surface of the positive hole injection transport layer 2 as the supplementary layer and the functional layer respectively. In the case of using the positive hole injection transport layer characterized in the present invention at a position of the positive hole injection layer as above, the positive hole injection transport layer forms a charge transfer complex to be insoluble in the solvent used for the solution applying method in addition to improvement in electroconductivity, thus, it is possible to apply the solution applying method when the positive hole transport layer is laminated on the positive hole injection transport layer. Furthermore, the improvement in the adhesion to the electrode can be expected.

Figure 3:
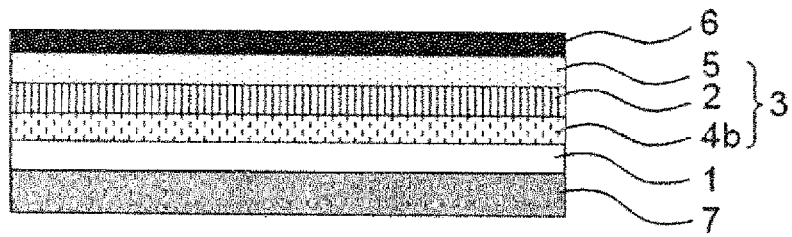
FIG. 3 is a schematic sectional view showing one of other examples of a constitution of layers of the organic EL element being one embodiment of the device of the present invention.

FIG. 3 is a schematic sectional view showing one of other examples of the constitution of layers of the organic EL element being one embodiment of the device of the present invention. The organic EL element of the present invention has an embodiment in which the positive hole injection layer 4b is formed on the surface of the electrode 1 as the supplementary layer, and the positive hole injection transport layer 2 and the light emitting layer 5 as the functional layer are laminated on the surface of the positive hole injection layer 4b. In the case of using the positive hole injection transport layer characterized in the present invention in a position of the positive hole injection layer as above, the positive hole injection transport layer forms the charge transfer complex to be insoluble in the solvent used for the solution applying method in addition to improvement in electroconductivity, thus, it is possible to apply the solution applying method when the light emitting layer is laminated on the positive hole injection transport layer.

Figure 4:
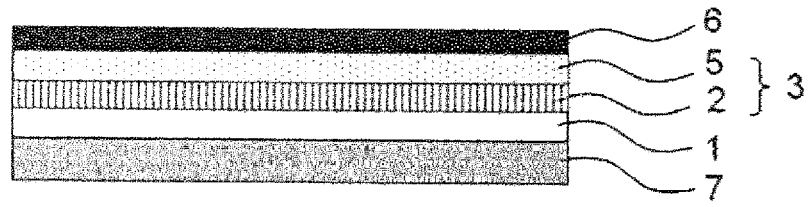
FIG. 4 is a schematic sectional view showing one of other examples of a constitution of layers of the organic EL element being one embodiment of the device of the present invention.

FIG. 4 is a schematic sectional view showing one of other examples of the constitution of layers of the organic EL element being one embodiment of the device of the present invention. The organic EL element of the present invention has an embodiment in which the positive hole injection transport layer 2 and the light emitting layer 5 as the functional layer are laminated in this order. In the case that the positive hole injection transport layer characterized in the present invention is used as a single layer as above, there is an advantage of reducing the number of steps in the process.

In FIGS. 2 to 4, each of the positive hole injection transport layer 2, the positive hole transport layer 4a, and the positive hole injection layer 4b may be constituted not by a single layer but by two or more layers.

In FIGS. 2 to 4, the electrode 1 functions as an anode and the electrode 6 functions as a cathode. The organic EL element has a function that, if the electric field is applied between the anode and cathode, the positive hole is injected from the anode to the light emitting layer 5 through the positive hole injection transport layer 2 and the positive hole transport layer 4, and the electron is injected from the cathode to the light emitting layer, thus, recombining of the injected positive hole and electron is performed in the light emitting layer 5 to emit light to the outside of the element.

In order to emit the light to the outside of the element, at least all layers on one surface of the light emitting layer are required to have permeability to the light of at least a part of wavelength in a visible wavelength range. In addition, if necessary, an electron transport layer and/or an electron injection layer may be disposed between the light emitting layer and the electrode 6 (cathode) (not shown in figures).

Figure 5:
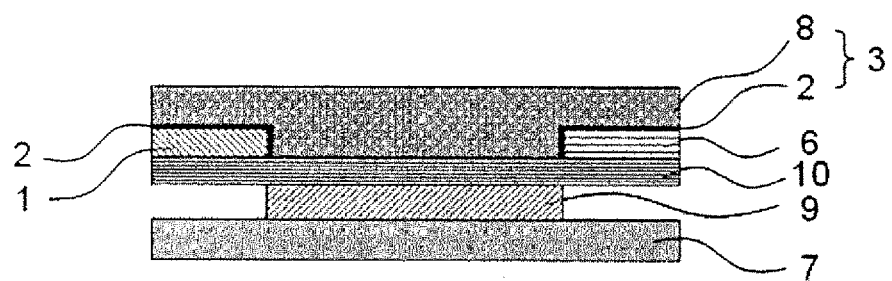
FIG. 5 is a schematic sectional view showing an example of a constitution of layers of the organic transistor being another embodiment of the device of the present invention.

FIG. 5 is a schematic sectional view showing an example of the constitution of layers of the organic transistor being another embodiment of the device of the present invention. The organic transistor comprises an electrode 9 (gate electrode), an electrode 1 (source electrode) and the electrode 6 (drain electrode) facing each other, an organic semiconductor layer 8 as the organic layer disposed between the electrode 9, the electrode 1 and the electrode 6, and an insulating layer 10 interposed between the electrode 9 and the electrode 1, and the electrode 9 and the electrode 6 on a substrate 7, and the positive hole injection transport layer 2 is formed on the surfaces of the electrode 1 and electrode 6.

The above organic transistor has a function of controlling currents between the source electrode and drain electrode by controlling the accumulation of the charges in the gate electrode.

Figure 6:
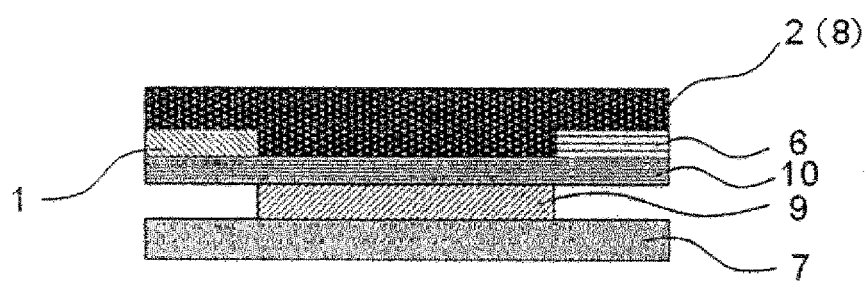
FIG. 6 is a schematic sectional view showing one of other examples of a constitution of layers of the organic transistor being another embodiment of the device of the present invention.

FIG. 6 is a schematic sectional view showing an example of another constitution of layers of the organic transistor being the embodiment of the device of the present invention. The organic transistor comprises an electrode 9 (gate electrode), an electrode 1 (source electrode) and an electrode 6 (drain electrode) facing each other, an organic semiconductor layer 8 consisting of the positive hole injection transport layer 2 of the present invention being formed as the organic layer disposed between the electrode 9, the electrode 1 and the electrode 6, and an insulating layer 10 interposed between the electrode 9 and the electrode 1, and the electrode 9 and the electrode 6 on a substrate 7. In this example, the positive hole injection transport layer 2 functions as the organic semiconductor layer 8.

The constitution of layers of the device of the present invention is not limited to the above examples, and one having a constitution substantially as same as the technical idea disclosed in claims of the present invention and providing similar function effects is included in the technical scope of the present invention.

Hereinafter, each layer of the device of the present invention will be described in detail.

(1) Positive Hole Injection Transport Layer

The device of the present invention contains at least the positive hole injection transport layer. In the case that the device of the present invention is an organic device and the organic layer comprises two or more layers, the organic layer contains the positive hole injection transport layer, and further contains a layer which plays a central role in the function of the device, and a supplementary layer which plays a supplementary role in supporting the functional layer. The functional layer and the supplementary layer will be described in detail in the specific example of the device that will be hereinafter described.

The positive hole injection transport layer of the device of the present invention contains at least the reaction product of the transition metal complex or complexes, in which at least one or more kinds of transition metals selected from the group consisting of vanadium, rhenium and platinum, or a mixture of molybdenum and one or more kinds of transition metals selected from the group consisting of vanadium, rhenium and platinum is contained in the central metal or metals of the transition metal complex or complexes. The positive hole injection transport layer of the device of the present invention may only comprise the reaction product of the transition metal complex or complexes, but may further contain other components. In particular, from the viewpoint of lowering driving voltage and further extending an element lifetime, it is preferable that the positive hole injection transport layer further contains the positive hole transport compound. The reaction product of the transition metal complex or complexes which may be contained in the positive hole injection transport layer of the present invention mean a reaction product produced by reaction of the transition metal complex or complexes occurred in the process of forming the positive hole injection transport layer, for example, in an ink for forming the positive hole injection transport layer (coating solution), when or after forming a layer, upon heating, upon light irradiation, upon using active oxygen, upon element driving, and the like.

In the case that the positive hole injection transport layer of the device of the present invention further contains the positive hole transport compound, the positive hole injection transport layer of the device of the present invention may comprise a mixed layer containing the reaction product of the transition metal complex or complexes and the positive hole transport compound, or may comprise two or more layers including the mixed layer. In addition, the positive hole injection transport layer may comprise two or more layers in which a layer containing the reaction product of the transition metal complex or complexes and a layer containing the positive hole transport compound are laminated. Furthermore, the positive hole injection transport layer may be a layer in which at least a layer containing the reaction product of the transition metal complex or complexes and a layer containing at least the reaction product of the transition metal complex or complexes and the positive hole transport compound are laminated.

The transition metal complex used in the present invention is a compound in which a transition metal atom of a central metal is bound to a ligand. The central metal is not particularly limited as long as it contains one or more kinds of transition metals selected from the group consisting of vanadium, rhenium and platinum. The central metal or metals can be one kind of transition metal alone or a mixture which is a combination of two or more kinds of transition metals. Or, the central metal or metals can be a mixture of any one or more of the above three kinds of metals and a different metal. By combining metals, it is possible to change ionization potential and thus to optimize carrier balance. Among them, from the viewpoint of ionization potential, a compound produced by combining the above three kinds of metals and molybdenum is particularly preferable. The type of the ligand is appropriately selected and not particularly limited, however, it is preferable that the ligand contains an organic part (carbon atom) from the viewpoint of solvent solubility and the adhesion to the adjacent organic layer. In addition, it is preferable that the ligand separates from the complex at relatively low temperature (for example, 200° C. or less).

Examples of unidentate ligands include an acyl, a carbonyl, a thiocyanate, an isocyanate, a cyanate, an isocyanate group and a halogen atom. In particular, hexacarbonyl, which is easily decomposed at relatively low temperature, is preferable.

In addition, specific examples of the structure containing an aromatic ring and/or heterocyclic ring include benzene, triphenylamine, fluorene, biphenyl, pyrene, anthracene, carbazole, phenylpyridine, trithiophene, phenyloxadiazole, phenyltriazole, benzimidazole, phenyltriazine, benzodiathiazine, phenylquinoxaline, phenylenevinylene, phenylsilole, and a combination of the above structures.

Unless the effect of the present invention is interfered, the structure containing the aromatic ring and/or heterocyclic ring may contain a substituent. Examples of the substituent include a linear or branched alkyl group having 1 to 20 carbon atoms, a halogen atom, an alkoxy group having 1 to 20 carbon atoms, a cyano group, and a nitro group. In the linear or branched alkyl group having 1 to 20 carbon atoms, a linear or branched alkyl group having 1 to 12 carbon atoms, for example, a methyl group, an ethyl group, a propyl group, an isopropyl group, a butyl group, an isobutyl group, a sec-butyl group, a tert-butyl group, a pentyl group, a hexyl group, a heptyl group, an octyl group, a nonyl group, a decyl group, an undecyl group, a dodecyl group, etc. is preferable.

In addition, as the ligand, the unidentate ligand or a bidentate ligand is preferable from the viewpoint of increasing the reactivity of the transition metal complex. If the complex itself is stabilized too much, the reactivity may decrease.

It is preferable that the reaction product of the transition metal complex or complexes are the transition metal oxide or oxides produced by the reaction of the transition metal complex or complexes and an organic solvent having a carbonyl group and/or hydroxyl group. Since the transition metal complex has high reactivity, if heating or light irradiation are performed, or active oxygen is used in the process of forming the positive hole injection transport layer, for example, in the ink for forming the positive hole injection transport layer, or upon forming a layer using the ink, in the case that an organic solvent contained in the ink for forming the positive hole injection transport layer is an organic solvent containing a carbonyl group and/or hydroxyl group, a redox reaction of the transition metal complex and the organic solvent is performed, thus, at least a part of the complex becomes a transition metal oxide.

It is preferable that oxides of transition metal complexes in which central metals thereof have different oxidation numbers, coexist and are contained in the above transition metal oxide. Because of this, positive hole transport and positive hole injection properties are appropriately controlled by the balance of oxidation numbers; therefore, it is possible to improve decrease in driving voltage and device life.

In the transition metal oxides, depending on the treatment condition, transition metal atoms with various valences and various compounds such as carbide and nitride can coexist.

The organic solvent containing the carbonyl group and/or hydroxyl group used in the present invention is not particularly limited as long as the redox reaction of the organic solvent and the transition metal complex is appropriately performed.

Examples of the organic solvent containing the carbonyl group and/or hydroxyl group include aldehydes, ketones, carboxylic acids, esters, amides, alcohols and phenols, and ones having boiling temperatures from 50 to 250° C. can be suitably used. Specific examples of the organic solvent containing the carbonyl group and/or hydroxyl group include ketone solvents such as acetone, methyl ethyl ketone, 2-pentanone, 3-pentanone, 2-hexanone, 2-heptanone, 4-heptanone, methyl isopropyl ketone, diisobutylketone, acetonylacetone, isophorone, and cyclohexanone; aldehyde solvents such as acetaldehyde, propionaldehyde, furfural, and benzaldehyde; carboxylic acid solvents such as acetic acid, propionic acid, butyric acid, and valeric acid; ester solvents such as ethyl acetate, n-propyl acetate, i-propyl acetate, n-butyl acetate, i-butyl acetate, n-amyl acetate, ethylbenzoate and butylbenzoate; amide solvents such as N-methylformamide, N,N-dimethylformamide, and N-ethylacetamide; alcohol solvents such as methyl alcohol, ethyl alcohol, propyl alcohol, isopropyl alcohol, glycerin, ethylene glycol, propylene glycol, 1,2-butylene glycol, cyclohexanol, ethylene glycol monomethyl ether, ethylene glycol monoethyl ether, and diethylene glycol monoethyl ether; and phenol solvents such as phenol, cresol, xylenol, ethylphenol, trimethylphenol, isopropyl phenol, and t-butylphenol.

On the other hand, as the positive hole transport compound used in the present invention, a compound having positive hole transport property can be appropriately used. The positive hole transport property as used herein means that overcurrent by positive hole transport is observed by a known photocurrent method.

As the positive hole transport compound, a polymer compound is suitably used besides a low molecular weight compound. A positive hole transport polymer compound means a polymer compound having the positive hole transport property and a weight-average molecular weight of 2,000 or more in terms of polystyrene by gel permeation chromatography. In the positive hole injection transport layer of the present invention, as a positive hole transport material, it is preferable to use a polymer compound easily soluble in the organic solvent and capable of forming a stable coating film in which compounds hardly aggregates, in order to form a stable film by the solution applying method.

The positive hole transport compound is not particularly limited, and the examples include arylamine derivatives, anthracene derivatives, carbazole derivatives, thiophene derivatives, fluorene derivatives, distyryl benzene derivatives, and spiro compounds. Specific examples of the arylamine derivatives include N,N'-bis-(3-methylphenyl)-N,N'-bis-(phenyl)-benzidine (TPD), bis(N-(1-naphthyl-N-phenyl)benzidine) (α-NPD), 4,4',4"-tris(3-methylphenylphenylamino)triphenylamine (MTDATA), and 4,4',4"-tris(N-(2-naphthyl)-N-phenylamino)triphenylamine (2-TNATA). Specific examples of the carbazole derivatives include 4,4-N,N'-dicarbazole-biphenyl (CBP), etc. Specific examples of the fluorene derivatives include N,N'-bis(3-methylphenyl)-N,N'-bis(phenyl)-9,9-dimethylfluorene (DMFL-TPD), etc. Specific examples of the distyryl benzene derivatives include 4-(di-p-tolylamino)-4'-[(di-p-tolylamino)styryl]stilbene (DPAVB), etc. Specific examples of the spiro compounds include 2,7-bis(N-naphthalene-1-yl-N-phenylamino)-9,9-spirobifluorene (Spiro-NPB), and 2,2',7,7'-tetrakis(N,N-diphenylamino)-9,9'-spirobifluorene (Spiro-TAD).

In addition, as the positive hole transport polymer compound, a polymer containing an arylamine derivative, an anthracene derivative, a carbazole derivative, a thiophene derivative, a fluorene derivative, a distyryl benzene derivative, or a spiro compound in a repeating unit can be exemplified.

Specific examples of the polymers containing the arylamine derivative in the repeating unit include non-conjugated polymers such as copoly[3,3'-hydroxy-tetraphenylbenzidine/diethylene glycol]carbonate (PC-TPD-DEG), PTPDES and Et-PTPDEK represented by the structures described below, and conjugated polymers such as poly[N,N'-bis(4-butylphenyl)-N,N'-bis(phenyl)-benzidine]. Specific examples of the polymers containing the anthracene derivative in the repeating unit include poly[(9,9-dioctylfluorenyl-2,7-diyl)-co-(9,10-anthracene)], etc. Specific examples of the polymers containing the carbazole in the repeating unit include polyvinylcarbazole (PVK), etc. Specific examples of the polymers containing the thiophene derivative in the repeating unit include poly[(9,9-dioctylfluorenyl-2,7-diyl)- co-(bithiophene)], etc. Specific examples of the polymers containing the fluorene derivative in the repeating unit include poly[(9,9-dioctylfluorenyl-2,7-diyl)-co-(4,4'-(N-(4-sec-butylphenyl))diphenylamine)] (TFB), etc. Specific examples of the polymers containing the spiro compound in the repeating unit include poly[(9,9-dioctylfluorenyl-2,7-diyl)-alt-co-(9,9'-spiro-bifluorene-2,7-diyl)], etc. These positive hole transport polymer compounds may be used alone or in combination of two or more kinds.

The arrangement of two repeating units is arbitrarily selected. For example, it may be any of a random copolymer, alternative copolymer, periodic copolymer and block copolymer.

The average of n is preferably from 5 to 5,000, more preferably from 10 to 3,000. The average of m is preferably from 5 to 5,000, more preferably from 10 to 3,000. In addition, the average of n+m is preferably from 10 to 10,000, more preferably from 20 to 6,000.

[Chemical formula 1]

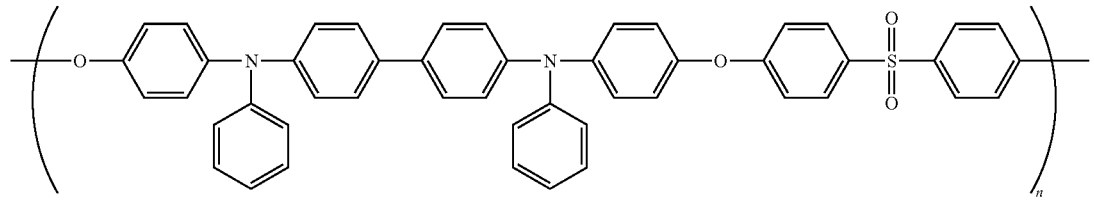

PTPDES

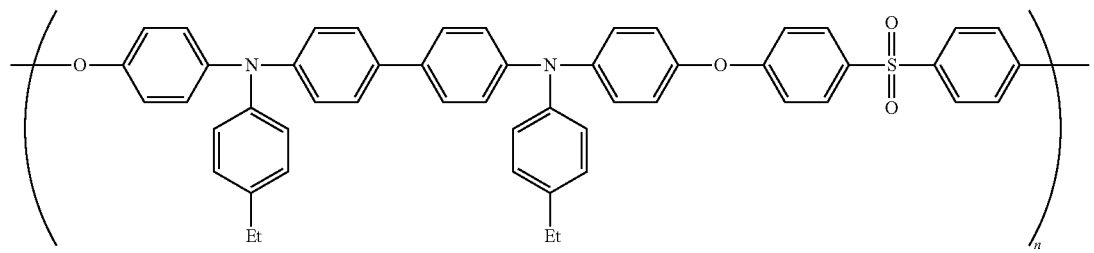

Et-PTPDEK

Among the above, it is preferable that the positive hole transport polymer compound is a compound represented by the following formula (1) from the viewpoint of obtaining good stability of adhesion to the adjacent organic layer and having the HOMO energy value between that of an anode substrate and that of a light emitting layer material.

[Chemical formula 2]

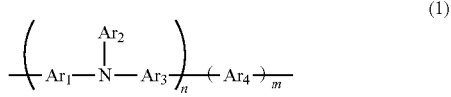

(1)

wherein $Ar_1$ to $Ar_4$ may be the same or different from each other; each of $Ar_1$ to $Ar_4$ represents an unsubstituted or substituted aromatic hydrocarbon group comprising 6 or more and 60 or less carbon atoms relating to a conjugated bond, or an unsubstituted or substituted heterocyclic group comprising 4 or more and 60 or less carbon atoms relating to the conjugated bond; n is 0 to 10,000; m is 0 to 10,000; n+m is 10 to 20,000; and the arrangement of two repeating units is arbitrarily selected.

In $Ar_1$ to $Ar_4$ of the above formula (1), specific examples of an aromatic hydrocarbon in the aromatic hydrocarbon group include benzene, fluorene, naphthalene, anthracene, a combination thereof, derivatives thereof, phenylenevinylene derivatives, and styryl derivatives. In addition, specific examples of a heterocyclic ring in the heterocyclic group include thiophene, pyridine, pyrrole, carbazole, a combination thereof, and derivatives thereof.

In the case that $Ar_1$ to $Ar_4$ of the above formula (1) contain a substituent, the substituent is preferably a linear or branched alkyl group or alkenyl group having 1 to 12 carbon atoms, such as a methyl group, an ethyl group, a propyl group, an isopropyl group, a butyl group, an isobutyl group, a sec-butyl group, a tert-butyl group, a pentyl group, a hexyl group, a heptyl group, an octyl group, a nonyl group, a decyl group, an undecyl group, a dodecyl group, a vinyl group, and an allyl group.

Preferable specific examples of the compound represented by the above formula (1) include poly[(9,9-dioctylfluorenyl-2,7-diyl)-co-(4,4'-(N-(4-sec-butylp henyl))diphenylamine)] (TFB) represented by the following formula (2), poly[(9,9-dioctylfluorenyl-2,7-diyl)-alt-co-(N,N'-bis{4-butylphenyl}-benzidine N,N'-{1,4-diphenylene})] represented by the following formula (3), and poly[(9,9-dioctylfluorenyl-2,7-diyl)] (PFO) represented by the following formula (4).

[Chemical formula 3]

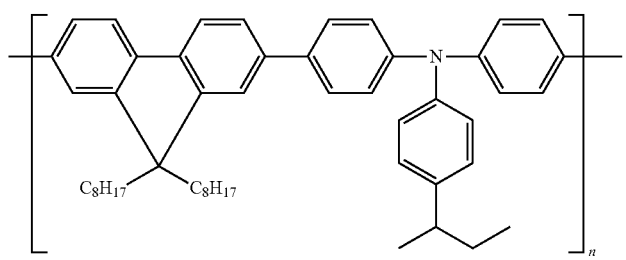
(2)

[Chemical formula 4]

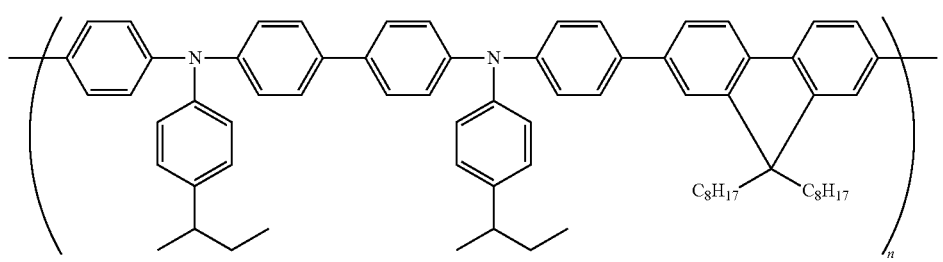
(3)

[Chemical formula 5]

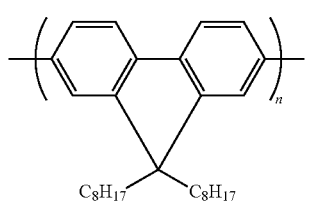
(4)

In the case of using the positive hole transport compound in the positive hole injection transport layer of the present invention, the content of the positive hole transport compound is preferably from 10 to 10,000 parts by weight with respect to 100 parts by weight of the reaction product of the transition metal complex or complexes, from the viewpoint of improving the positive hole injection transport property and achieving a long lifetime due to high stability of a film.

If the content of the positive hole transport compound in the positive hole injection transport layer is too low, it may be difficult to obtain the synergistic effect of having the positive hole transport compound mixed. On the other hand, if the content of the positive hole transport compound is too high, it becomes difficult to obtain the effect of using the transition metal complex or complexes.

Unless the effect of the present invention is interfered, the positive hole injection transport layer of the present invention may contain an additive such as a binder resin, a curable resin or a coating property improver. Examples of the binder resin include a polycarbonate, a polystyrene, a polyarylate, and a polyester, and a binder resin which can be cured by heat or light may be contained. As the material which can be cured by heat or light, the positive hole transport compound having a curable functional group in the molecule or a curable resin can be used. Specific examples of the curable functional group include acrylic functional groups such as an acryloyl group and a methacryloyl group; a vinylene group; an epoxy group; and an isocyanate group. The curable resin may be a thermosetting resin or photocurable resin, and the examples include an epoxy resin, a phenol resin, a melamine resin, a polyester resin, a polyurethane resin, a silicon resin, and a silane coupling agent.

The film thickness of the positive hole injection transport layer can be appropriately determined according to the purpose or an adjacent layer thereof, and is generally from 0.1 to 1,000 nm, preferably from 1 to 500 nm.

In addition, the work function of the positive hole injection transport layer is preferably from 5.0 to 6.0 eV, more preferably from 5.0 to 5.8 eV, from the viewpoint of positive hole injection efficiency.

It is preferable that the positive hole injection transport layer of the present invention is formed by the solution applying method from the viewpoint of easy production process and high yield since it is less likely to short out, and achieving a long lifetime due to formation of a charge transfer complex. In particular, it is preferable that the positive hole injection transport layer of the present invention is formed by the solution applying method using a solution (ink for forming a positive hole injection transport layer) dissolved or dispersed in the solvent in which at least the transition metal complex or complexes are suitably dissolved or dispersed. In addition, in the case that the positive hole transport compound is also used, it is preferable that the positive hole injection transport layer of the present invention is formed by the solution applying method using a solution in which the transition metal complex or complexes and the positive hole transport compound are mixed in the solvent in which both the above complex and the compound are suitably dissolved or dispersed. In this case, if the transition metal complex or complexes and the positive hole transport compound are mixed in the solvent in which both the transition metal complex or complexes and the positive hole transport compound are suitably dissolved or dispersed, the reaction product of the transition metal complex or complexes and the positive hole transport compound are interacted each other and the charge transfer complex is easily formed, thus, the positive hole injection transport layer having an excellent positive hole transport property and temporal stability of a film can be formed. As described above, the positive hole injection transport layer which forms the charge transfer complex tends to be insoluble in the solvent used when the positive hole injection transport layer is formed, therefore, even in the case of forming the organic layer which corresponds to the layer on the positive hole injection transport layer, a possibility of using the solution applying method can be expanded without eluting the positive hole injection transport layer.

The solution applying method will be described in "Method for producing device" described hereinafter.

(2) Substrate

The substrate is a support medium of the device of the present invention. The material of the substrate may be, for example, a flexible material or a hard material. Examples of the material which can be specifically used include a glass, a quartz, a polyethylene, a polypropylene, a polyethylene a terephthalate, a polymethacrylate, a polymethylmethacrylate, a polymethylacrylate, a polyester, and a polycarbonate.

Among the above, in the case of using a substrate made of a synthetic resin, it preferably has gas barrier property. The thickness of the substrate is not particularly limited, and is generally from around 0.5 to 2.0 mm.

(3) Electrode

The device of the present invention comprises the substrate, and two or more electrodes facing each other disposed on the substrate.

In the device of the present invention, the electrode is preferably formed of a metal or a metal oxide, and a known material can be appropriately employed. Generally, the electrode can be formed of a metal such as aluminum, gold, silver, nickel, palladium or platinum, or a metal oxide such as an oxide of indium and/or tin, etc.

Generally, there are many cases that the electrode is formed on the substrate by a method such as a sputtering method or a vacuum vapor deposition method, however, it can be formed by a wet process such as a coating method or a dip method. The thickness of the electrode varies depending on transparency or the like required for each electrode. If the transparency is required, the light transmittance in a visible light wavelength region of the electrode is generally 60% or more, preferably 80% or more. In this case, the thickness of the electrode is generally from about 10 to 1,000 nm, preferably from about 20 to 500 nm.

In the present invention, the device may further comprise a metal layer on the electrode to improve the stability of adhesion to a charge injection material. The metal layer means a layer containing a metal, and is formed of the metal or the metal oxide generally used for the electrode described above.

(4) Others

The device of the present invention may comprise a known electron injection layer and/or electron transport layer, if necessary, between an electron injection electrode and the positive hole injection transport layer.

2. Organic EL Element

As an embodiment of the device of the present invention, an organic EL element comprising the organic layer containing at least the positive hole injection transport layer of the present invention and the light emitting layer can be exemplified.

Hereinafter, layers which constitute the organic EL element will be described in order using FIGS. 2 to 4.

(Substrate)

The substrate 7 is a support medium of the organic EL element. The material of the substrate may be, for example, a flexible material or a hard material. Specifically, for example, one described in "Substrate" for the device can be used.

If light emitted at the light emitting layer 5 transmits the substrate 7 side and is taken therefrom, at least the substrate 7 is required to be a transparent material.

(Anode and Cathode)

Either the electrode 1 or the electrode 6 is required to have transparency depending on the direction that light emitted at the light emitting layer 5 is taken. The electrode 1 needs to be formed of a transparent material if light emitted from the light emitting layer 5 is taken from the substrate 7 side, and the electrode 6 needs to be formed of a transparent material if light emitted from the light emitting layer 5 is taken from the electrode 6 side.

The electrode 1 disposed on the light emitting layer side of the substrate 7 functions as an anode which injects a positive hole to the light emitting layer, and the electrode 6 disposed on the light emitting layer side of the substrate 7 functions as a cathode which injects an electron to the light emitting layer 5.

In the present invention, it is preferable that the anode and cathode are formed of the metal or metal oxide described in "Electrode" for the device described above.

(Positive Hole Injection Transport Layer, Positive Hole Transport Layer, and Positive Hole Injection Layer)

As shown in FIGS. 2 to 4, the positive hole injection transport layer 2, the positive hole transport layer 4a, and the positive hole injection layer 4b are appropriately formed between the light emitting layer 5 and the electrode 1 (anode). As shown in FIG. 2, the positive hole transport layer 4a is further laminated on the positive hole injection transport layer 2 of the present invention, and the light emitting layer may be laminated thereon. As shown in FIG. 3, the positive hole injection transport layer 2 of the present invention is further laminated on the positive hole injection layer 4b, and the light emitting layer may be laminated thereon. As shown in FIG. 4, the positive hole injection transport layer 2 of the present invention is laminated on the electrode 1, and the light emitting layer is laminated thereon.

As shown in FIG. 2, in the case that the positive hole transport layer 4a is further laminated on the positive hole injection transport layer 2 of the present invention, a positive hole transport material used for the positive hole transport layer 4a is not particularly limited, and the positive hole transport compound described in "Positive hole injection transport layer" of the present invention is preferably used. Among the above, it is preferable to use a compound similar to the positive hole transport compound used for the adjacent positive hole injection transport layer 2 of the present invention from the viewpoint of improving the stability of adhesion of the interface between the positive hole injection transport layer and the positive hole transport layer, and contributing to the achievement of a long driving lifetime.

The positive hole transport layer 4a can be formed of the positive hole transport material by a method similar to that of the light emitting layer that will be described hereinafter. The thickness of the positive hole transport layer 4a is generally from 0.1 to 1 μm, preferably from 1 to 500 nm.

As shown in FIG. 3, in the case that the positive hole injection transport layer 2 of the present invention is further laminated on the positive hole injection layer 4b, a positive hole injection material used for the positive hole injection layer 4b is not particularly limited, and a known compound can be used. Examples of the compound include phenylamines; starburst-type amines; phthalocyanines; oxides such as a vanadium oxide, a molybdenum oxide, a ruthenium oxide and an aluminum oxide; amorphous carbon; and derivatives of polyaniline and polythiophene.

The positive hole injection layer 4b can be formed of the positive hole injection material by a method similar to that of the light emitting layer that will be described hereinafter. The thickness of the positive hole injection layer 4b is generally from 1 nm to 1 µm, preferably from 2 to 500 nm, more preferably from to 200 nm.

Furthermore, considering positive hole injection property, it is preferable that the positive hole injection material and positive hole transport material may be selected so as to make the value of work function (HOMO) of each layer larger in a stepwise manner from the electrode 1 side to the light emitting layer 5 being an organic layer so that an energy barrier of the positive hole injection at each interface reduces as much as possible, and a large energy barrier of the positive hole injection between the electrode 1 and the light emitting layer 5 is supplemented.

Specifically, for example, in the case that ITO (work function 5.0 eV right after UV ozone cleaning) is used for the electrode 1, and Alq3 (HOMO 5.7 eV) is used for the light emitting layer 5, it is preferable that a reaction product of a vanadium complex (work function 5.2 eV) is selected as a material constituting the positive hole injection transport layer, and TFB (work function 5.4 eV) is selected as a material constituting the positive hole transport layer, and layers are arranged so as to have a layer constitution in which the value of the work function of each layer is sequentially larger from the electrode 1 side to the light emitting layer 5. The value measured by photoelectron spectroscopy by means of a photoelectron spectrometer (product name: AC-1; manufactured by Riken Keiki Co., Ltd.) is used for the value of the work function or HOMO described above.

In the case of such a layer constitution, the large energy barrier of the positive hole injection between the electrode 1 (work function 5.0 eV right after UV ozone cleaning) and the light emitting layer 5 (for example, HOMO 5.7 eV) can be supplemented so that the vales of HOMO become stepwise. Therefore, the positive hole injection transport layer having an excellent positive hole injection efficiency can be obtained.

(Light Emitting Layer)

As shown in FIGS. 2 to 4, the light emitting layer 5 is formed of an emitting material between the substrate 7 on which the electrode 1 is formed and the electrode 6.

The material used for the light emitting layer of the present invention is not particularly limited as long as it is generally used for the emitting material, and either a fluorescent material or a phosphorescent material can be used. More specifically, materials such as a dye based light emitting material and a metal complex based light emitting material can be exemplified, and either a low molecular weight compound or a polymer compound can be used.

(Specific Example of Dye Based Light Emitting Material)

Examples of the dye based light emitting material include arylamine derivatives, anthracene derivatives, (phenylanthracene derivatives), oxadiazole derivatives, oxazole derivatives, oligothiophene derivatives, carbazole derivatives, cyclopentadiene derivatives, silole derivatives, distyryl benzene derivatives, distyryl pyrazine derivatives, distyryl arylene derivatives, silole derivatives, stilbene derivatives, Spiro compounds, thiophene ring compounds, tetraphenylbutadiene derivatives, triazole derivatives, triphenylamine derivatives, trifumanylamine derivatives, pyrazoloquinoline derivatives, hydrazone derivatives, pyrazoline dimers, pyridine ring compounds, fluorene derivatives, phenanthrolines, perinone derivatives, and perylene derivatives. In addition, a dimer, trimer or oligomer thereof, or a compound containing two or more kinds of derivatives can be used.

These materials may be used alone or in combination of two or more kinds.

(Specific Example of Metal Complex Based Light Emitting Material)

Examples of the metal complex based light emitting material include an aluminum quinolinol complex, a benzoquinolinol beryllium complex, a benzoxazole zinc complex, a benzothiazole zinc complex, an azomethyl zinc complex, a porphyrin zinc complex, and an europium complex; and a metal complex which has a central metal including Al, Zn, Be or the like or a rare-earth metal such as Tb, Eu, Dy, and has a ligand such as oxadiazole, thiadiazole, phenylpyridine, phenylbenzimidazole, and quinoline structure.

These materials may be used alone or in combination of two or more kinds.

(Specific Example of Polymer Light Emitting Material)

As the polymer light emitting material, a polymer or a dendrimer in which the above low molecular weight material is introduced in a molecule as a straight chain, a side chain, or a functional group can be used. The examples include poly p-phenylenevinylene derivatives, polythiophene derivatives, poly p-phenylene derivatives, polysilane derivatives, polyacetylene derivatives, polyvinylcarbazole derivatives, polyfluorenone derivatives, polyfluorene derivatives, polyquinoxaline derivatives, and copolymers thereof.

(Specific Example of Dopant)

A doping material may be added in the light emitting layer for the purpose of improving light emitting efficiency or changing a light emitting wavelength. In the case of a polymer material, the doping material may be contained in a molecular structure as a light emitting group. Examples of such a doping material include perylene derivatives, coumarin derivatives, rubrene derivatives, quinacridone derivatives, squarylium derivatives, porphyrin derivatives, a styryl dye, tetracene derivatives, pyrazoline derivatives, decacyclene, phenoxazone, quinoxaline derivatives, carbazole derivatives, and fluorene derivatives. In addition, a compound in which a spiro group is introduced to one of the above derivatives can be used.

These materials may be used alone or in combination of two or more kinds.

In addition, as a phosphorescence dopant, an organometallic complex which has a heavy metal ion such as platinum or iridium in center and exhibits phosphorescence can be used. Specifically, $Ir(ppy)_3$, $(ppy)_2Ir(acac)$, $Ir(BQ)_3$, $(BQ)_2Ir(acac)$, $Ir(THP)_3$, $(THP)_2Ir(acac)$, $Ir(BO)_3$, $(BO)_2(acac)$, $Ir(BT)_3$, $(BT)_2Ir(acac)$, $Ir(BTP)_3$, $(BTP)_2Ir$ (acac), FIr6 or PtOEP can be used. These materials can be used alone or in combination of two or more kinds.

In the present invention, as the material for the light emitting layer, either a low molecular weight compound or a polymer compound which emits fluorescence, or a low molecular weight compound or a polymer compound which emits phosphorescence may be used. In the present invention, in the case that a base layer on which the light emitting layer is provided is the positive hole injection transport layer of the present invention, the positive hole injection transport layer forms the charge transfer complex to be insoluble in a nonaqueous solvent such as xylene or the like used for the solution applying method, therefore, as the material for the light emitting layer, it is possible to use the polymer material which can be easily soluble in the nonaqueous solvent such as xylene or the like and forms a layer by the solution applying method. In this case, a polymer compound which emits fluorescence, a polymer compound containing a low molecular weight compound which emits fluorescence, a polymer compound which emits phosphorescence, or a polymer compound containing a low molecular weight compound which emits phosphorescence can be suitably used.

The light emitting layer can be formed of the emitting material by the solution applying method, vapor deposition method or transfer method. A solution applying method and vapor deposition method similar to those in "Method for producing device" that will be described hereinafter can be used. The transfer method is a method, for example, that the light emitting layer formed on a film in advance by the solution applying method or vapor deposition method is attached on the positive hole injection transport layer 2 provided on the electrode, and the light emitting layer 5 is transferred on the positive hole injection transport layer 2 by heating. In addition, the positive hole injection transport layer side of a laminate in which the film, the light emitting layer 5, and the positive hole injection transport layer 2 are laminated in this order may be transferred on the electrode.

The thickness of the light emitting layer is generally from about 1 to 1,000 nm, preferably from about 20 to 500 nm. In the present invention, the positive hole injection transport layer is suitably formed by the solution applying method, therefore, there is an advantage of being able to reduce the process cost in the case that the light emitting layer is also formed by the solution applying method.

3. Organic Transistor

As another embodiment of the device of the present invention, an organic transistor can be exemplified. Hereinafter, layers constituting the organic transistor will be described using FIGS. 5 and 6.

In the organic transistor of the present invention as shown in FIG. 5, the positive hole injection transport layer 2 is formed on the surfaces of the electrode 1 (source electrode) and the electrode 6 (drain electrode) so that positive hole injection transport property between the electrode 1 and the organic semiconductor layer, and the electrode 6 and the organic semiconductor becomes high, and film stability of the positive hole injection transport layer of the present invention is high. Thereby, it contributes to the achievement of the long driving lifetime.

In the organic transistor of the present invention, as shown in FIG. 6, the positive hole injection transport layer 2 of the present invention may function as the organic semiconductor layer 8.

In addition, in the organic transistor of the present invention, as shown in FIG. 5, the positive hole injection transport layer 2 may be formed on the surfaces of the electrode 1 (source electrode) and electrode 6 (drain electrode), and the positive hole injection transport layer 2 of the present invention, which is made of a different material from that of the positive hole injection transport layer formed on the surface of the electrode may be further formed as the organic semiconductor layer 8.

In the case that the organic transistor as shown in FIG. 5 is formed, as the material which forms the organic semiconductor layer, a low molecular or polymer organic semiconductor material having a donating property (p type) can be used.

As the organic semiconductor material, examples to be used include porphyrin derivatives, arylamine derivatives, polyacene derivatives, perylene derivatives, rubrene derivatives, coronene derivatives, perylene tetracarboxylic acid diimide derivatives, perylene tetracarboxylic dianhydride derivatives, polythiophene derivatives, poly p-phenylene derivatives, poly p-phenylenevinylene derivatives, polypyrrole derivatives, polyaniline derivatives, polyfluorene derivatives, polythiophenevinylene derivatives, polythiophene-heterocyclic aromatic copolymers and derivatives thereof; α-6-thiophene, α-4-thiophene; oligoacene derivatives such as naphthalene; oligothiophene derivatives of α-5-thiophene, etc.; pyromellitic dianhydride derivatives; and pyromellitic diimide derivatives. Specifically, examples of the porphyrin derivatives include metalphthalocyanine such as phthalocyanine and copper phthalocyanine, examples of the arylamine derivatives include m-TDATA, and examples of the polyacene derivatives include naphthalene, anthracene, naphthacene, and pentacene. In addition, there can be used a layer having improved conductive property by mixing Lewis acid, tetrafluoro tetracyanoquinodimethane ($F_4$-TCNQ), an inorganic oxide such as that of vanadium or molybdenum with any of the porphyrin derivatives and triphenylamine derivatives.

Even in the case of forming the organic transistor comprising the positive hole injection transport layer of the present invention as shown in FIG. 5, as a compound constituting the organic semiconductor layer 8, it is preferable to use the positive hole transport compound, in particular, the positive hole transport polymer compound is used for the positive hole injection transport layer of the present invention, from the viewpoint of improving the stability of adhesion to the interface between the positive hole injection transport layer 2 of the present invention and the organic semiconductor layer 8, and contributing to the achievement of the long driving lifetime.

It is preferable that carrier mobility of the organic semiconductor layer is $10^{-6}$ cm/Vs or more, particularly for the organic transistor, $10^{-3}$ cm/Vs or more is preferable from the view point of transistor property.

In addition, the organic semiconductor layer can be formed by the solution applying method or a dry process similarly as the light emitting layer of the organic EL element.

The substrate, the gate electrode, the source electrode, the drain electrode and the insulating layer may not be particularly limited and can be formed by using the following materials.

The substrate 7 is a support medium of the device of the present invention. The material of the substrate may be, for example, a flexible material or a hard material. Specifically, a similar material to that of "Substrate" of the organic EL element can be used.

The material of the gate electrode, source electrode and drain electrode is not particularly limited if it is a conductive material. However, it is preferable that the material is a metal or a metal oxide from the viewpoint of forming the positive hole injection transport layer 2 wherein the coordination compound containing the metal ion is adsorbed using the charge transport material of the present invention. Specifically, a similar metal or metal oxide to that of the electrode of the organic EL element can be used, particularly, platinum, gold, silver, copper, aluminum, indium, ITO and carbon are preferable.

For the insulating layer which insulates the gate electrode, various kinds of insulating materials can be used. Also, either an inorganic oxide or an organic compound can be used, particularly, an inorganic oxide having high relative permittivity is preferable. Examples of the inorganic oxide include silicon oxide, aluminum oxide, tantalum oxide, titanium oxide, tin oxide, vanadium oxide, barium strontium titanate, barium zirconate titanate, lead zirconate titanate, lead lanthanum titanate, strontium titanate, barium titanate, barium magnesium fluoride, bismuth titanate, strontium bismuth titanate, strontium bismuth tantalate, bismuth niobate tantalate, and yttrium trioxide. Among the above, silicon oxide, aluminum oxide, tantalum oxide and titanium oxide are preferable. Also, an inorganic nitride such as silicon nitride, or aluminum nitride can be suitably used.

As the organic compound, a polyimide, a polyamide, a polyester, a polyarylate, a photoradical polymerizable or photocationic polymerizable photocurable resin, a copolymer containing an acrylonitrile component, a polyvinylphenol, a polyvinylalcohol, a novolak resin, cyanoethylpullulan, or a phosphazene compound containing a polymer or an elastomer can be used.

Other constitutions of other organic devices such as a dye-sensitized solar battery, an organic thin film solar battery and an organic semiconductor, an oxide compound solar battery and a quantum dot light emitting element having the positive hole injection transport layer are not particularly limited as long as the above positive hole injection transport layer is the positive hole injection transport layer of the present invention, and may be the same as a known constitution.

4. Method for Producing Device

The method for producing the device of the present invention comprises a substrate, two or more electrodes facing each other disposed on the substrate and a positive hole injection transport layer disposed between two electrodes among the two or more electrodes, the method comprising: a preparation step of preparing an ink for forming the positive hole injection transport layer, containing an organic solvent having a carbonyl group and/or hydroxyl group and a transition metal complex or complexes in which at least one or more kinds of transition metals selected from the group consisting of vanadium, rhenium and platinum or a mixture of molybdenum and one or more kinds of transition metals selected from the group consisting of vanadium, rhenium and platinum is contained in a central metal or metals of the transition metal complex or complexes; a formation step of forming the positive hole injection transport layer on any of layers on the electrodes using the ink for forming the positive hole injection transport layer; and an oxidation step of at least partially oxidizing the transition metal complex or complexes to produce a transition metal oxide or oxides.

In the method for producing the device of the present invention, the positive hole injection transport layer is formed of the ink for forming the positive hole injection transport layer by the solution applying method as described above. By using the solution applying method, it is possible to form a device having a high productivity and the stability of adhesion of the interface between the electrode and positive hole injection transport layer, and between the positive hole injection transport layer and organic layer, which does not require a vapor deposition apparatus and can coat separately without using a mask vapor deposition or the like upon forming the positive hole injection transport layer.

The solution applying method used herein means a method for forming the positive hole injection transport layer by preparing an ink for forming the positive hole injection transport layer, at least containing an organic solvent having a carbonyl group and/or hydroxyl group and a transition metal complex or complexes in which at least one or more kinds of transition metals selected from the group consisting of vanadium, rhenium and platinum or a mixture of molybdenum and one or more kinds of transition metals selected from the group consisting of vanadium, rhenium and platinum is contained in a central metal or metals of the transition metal complex or complexes, applying the ink onto an electrode or layer which acts as a base, and drying the applied ink. The ink for forming the positive hole injection transport layer can be prepared, if necessary, by adding the positive hole transport compound and an additive such as a binder resin which does not trap a positive hole or a coating property improver in a solvent to dissolve and disperse.

Examples of the solution applying method include a dipping method, a spray coating method, a spin coating method, a blade coating method, a dip coating method, a cast method, a roll coating method, a bar coating method, a die-coating method, and a liquid dropping method such as an ink-jet method. In the case of forming a monomolecular film, the dipping method or the dip coating method is suitably used.

As the solvent used for the ink, an organic solvent capable of performing a redox reaction with the transition metal complex and having a carbonyl group and/or hydroxyl group is used. As such an organic solvent, a similar organic solvent to that described above can be used. Among the organic solvents having the carbonyl group and/or hydroxyl group, an organic solvent which can be suitably dissolved and dispersed with other components such as the positive hole transport compound is appropriately selected to be used.

The method for producing the device of the present invention comprises the oxidation step of at least partially oxidizing the transition metal complex or complexes to produce the transition metal oxide or oxides, thereby, it is possible to form a layer containing a transition metal oxide or oxides which do not have solvent solubility not using the vapor deposition method but using the solution applying method. In addition, it is possible to change positive hole injection transport property appropriately while the adhesion to the adjacent organic layer is kept by at least partially oxidizing the transition metal complex or complexes to produce the transition metal oxide or oxides. Furthermore, it is possible to improve film strength by having the oxidation step.

In the method for producing the device of the present invention, after preparing the ink for forming the positive hole injection transport layer, the oxidation step may be performed before forming the positive hole injection transport layer, or after forming the positive hole injection transport layer.

That is, as one embodiment of the method for producing the device of the present invention, a method comprising: the preparation step of preparing the ink for forming the positive hole injection transport layer containing the transition metal complex or complexes and the organic solvent having a carbonyl group and/or hydroxyl group; the formation step of forming the positive hole injection transport layer containing the transition metal complex or complexes on any of layers on electrodes; and the oxidation step of at least partially oxidizing the transition metal complex or complexes in the positive hole injection transport layer to produce the transition metal oxide or oxides, can be exemplified. By using the above method, the positive hole injection transport layer containing the reaction product of the transition metal complex or complexes can be formed. The oxidation step may be performed after applying the ink for forming the positive hole injection transport layer in a form of layer on any of layers on the electrodes while drying the organic solvent in the layer containing the transition metal complex or complexes and the above organic solvent.

As another embodiment of the method for producing the device of the present invention is such that the oxidation step is performed after the preparation step of preparing the ink for forming the positive hole injection transport layer before the formation step of forming the positive hole injection transport layer so that the formation step of forming the positive hole injection transport layer containing the transition metal oxide or oxides on any of layers on the electrodes using the oxidized ink for forming the positive hole injection transport layer containing the transition metal oxide or oxides, can be exemplified. By using the above method, the positive hole injection transport layer containing the reaction product of the transition metal complex or complexes can be formed. After the layer is formed, another oxidation step may be further performed.

The oxidized ink for forming the positive hole injection transport layer can be obtained by performing a redox reaction between the transition metal and the organic solvent having the carbonyl group and/or hydroxyl group.

Examples of means of oxidizing the transition metal complex include a heating process, a light irradiation process, and a process of using active oxygen, and they may be appropriately used in a combination. Since oxidation is efficiently performed in the oxidation step, the oxidation step is preferably performed in the presence of oxygen.

In the case of using the heating process, examples of heating means include a heating method on a hot plate and a heating method in an oven. The heating temperature is preferably from 50 to 250° C. The heating temperature makes a difference in the reactivity of the transition metal complex, the interaction between the transition metal complexes, and the interaction for the positive hole transport compound of the transition metal complex, therefore, it is preferable that the heating temperature is appropriately adjusted.

In the case of using the light irradiation process, examples of light irradiation means include a method for exposing ultraviolet, etc. The amount of light irradiation makes a difference in the reactivity of the transition metal complex, the interaction between the transition metal complexes, and the interaction for the positive hole transport compound of the transition metal complex, therefore, it is preferable that the amount of irradiation is appropriately adjusted.

In the case of using the process of using active oxygen, examples of means of using active oxygen include a method for using active oxygen generated by ultraviolet, and a method for using active oxygen generated by exposing a photocatalyst such as a titanium oxide to ultraviolet. The amount of active oxygen makes a difference in the reactivity of the transition metal complex, the interaction for the positive hole transport compound of the transition metal complex, and the interaction between the transition metal complexes, therefore, it is preferable that the amount of active oxygen is appropriately adjusted.

As for other processes in the method for producing the device, a known process can be appropriately used.

EXAMPLES

Hereinafter, the present invention will be explained further in detail with reference to examples. The scope of the present invention is not limited to the following examples.

Example 1

On a glass substrate, a transparent anode, a laminate of a layer containing a reaction product of vanadium(III) acetylacetonate (organic-inorganic composite) and a layer containing a positive hole transport compound as a positive hole injection transport layer, a positive hole transport layer, a light emitting layer, an electron injection layer, and a cathode were formed as layers in this order and laminated. Then, sealing was finally performed to produce an organic EL element. The layers except the transparent anode and the positive hole injection transport layer were formed in a nitrogen purged glove box with water concentration of 0.1 ppm or less and oxygen concentration of 0.1 ppm or less.

Firstly, a thin film (thickness: 150 nm) of Indium Tin Oxide (ITO) was used as the transparent anode. A glass substrate with ITO (manufactured by Sanyo vacuum industries Co., Ltd.) was subjected to patterning in the form of stripe. The ITO substrate subjected to patterning was subjected to ultrasonic cleaning using a neutral detergent and ultrapure water in this order followed by UV-ozonation. HOMO (work function) of ITO after performing UV-ozonation was 5.0 eV.

Next, vanadium(III) acetylacetonate (a vanadium complex manufactured by Sigma-Aldrich Corporation) was dissolved in cyclohexanone in a concentration of 0.4 weight % to prepare a coating solution for forming a positive hole injection transport layer (1).

Then, the coating solution for forming the positive hole injection transport layer (1) was applied on a cleaned anode by a spin coating method to form a positive hole injection transport layer containing the vanadium complex. After applying the coating solution for forming the positive hole injection transport layer (1), the positive hole injection transport layer was dried at 200° C. for 30 minutes using a hot plate to evaporate the solvent. The thickness of the positive hole injection transport layer (1) after drying was 5 nm or less.

Next, on thus produced positive hole injection transport layer (1), a thin film (thickness: 10 nm) of poly[(9,9-dioctylfluorenyl-2,7-diyl)-co-(4,4'-(N-(4-sec-butylphenyl)) diphenylamine)] (TFB) being a conjugated polymer material was formed as a positive hole injection transport layer (2). It was formed by applying a solution in which TFB was dissolved in xylene in a concentration of 0.4 weight % by a spin coating method. After applying the TFB solution, the positive hole injection transport layer (2) was dried at 200° C. for 30 minutes using a hot plate to evaporate the solvent.

Then, on the thus-formed positive hole transport layer, a mixed thin film was formed as the light emitting layer by coating, the film containing tris[2-(p-tolyl)pyridine)] iridium (III) (Ir(mppy)$_3$) as a luminescent dopant and 4,4'-bis(2,2-carbazole-9-yl)biphenyl (CBP) as a host. The film was formed by applying a solution by spin coating, the solution being obtained by dissolving CBP in a concentration of 1 weight % and Ir(mppy)$_3$ in a concentration of 0.05 weight % in toluene being a solvent. After applying the ink, the ink was heated on a hotplate at 100° C. for 30 minutes to evaporate the solvent.

Next, on the light emitting layer, a thin film of a bis(2-methyl-8-quinolinolato)(p-phenyl phenolate) aluminum complex (BAlq) was formed by vapor deposition as a positive hole block layer. The BAlq thin film was formed under vacuum condition (pressure: $1 \times 10^{-4}$ Pa) by a resistance heating method so as to have a thickness of 15 nm.

Next, on the positive hole block layer, a thin film of a tris(8-quinolinolato) aluminum complex (Alq$_3$) was formed as an electron transport layer by vapor-deposition. The Alq$_3$ thin film was formed under vacuum condition (pressure: $1 \times 10^{-4}$ Pa) by a resistance heating method so as to have a thickness of 15 nm.

Next, on the thus-produced electron transport layer, a film of LiF (thickness: 0.5 nm) as the electron injection layer and a film of Al (thickness: 100 nm) as the cathode were sequentially formed under vacuum condition (pressure: $1 \times 10^{-4}$ Pa) by a resistance heating vapor deposition method.

Finally, after forming the cathode, the above layers were sealed in the glove box using alkali-free glass and a UV curable epoxy bonding agent, thus, the organic EL element of Example 1 was produced.

Example 2

The organic EL element of Example 2 was produced in the same manner as Example 1, except that the positive hole injection transport layer was formed of the coating solution for forming the positive hole injection transport layer (1) containing pentacarbonylchlororhenium(I) (a rhenium complex manufactured by Sigma-Aldrich Corporation) in place of vanadium(III) acetylacetonate.

Example 3

The organic EL element of Example 3 was produced in the same manner as Example 1, except that the positive hole injection transport layer was formed of the coating solution for forming the positive hole injection transport layer (1) containing platinum (II) acetylacetonate (a platinum complex manufactured by Sigma-Aldrich Corporation) in place of vanadium(III) acetylacetonate.

Example 4

The organic EL element of Example 4 was produced in the same manner as Example 1, except that the positive hole injection transport layer was formed of the coating solution for forming the positive hole injection transport layer (1) containing a mixture of pentacarbonylchlororhenium(I) (manufactured by Sigma-Aldrich Corporation) and molybdenum hexacarbonyl (manufactured by Kanto Chemical Co., Inc.) (a mixture of a rhenium complex and a molybdenum complex) in place of vanadium(III) acetylacetonate. The coating solution for forming the positive hole injection transport layer (1) was prepared by dissolving the above two kinds of materials each in a concentration of 0.2 weight % in cyclohexanone.

Reference Example 1

The organic EL element of Reference Example 1 was produced in the same manner as Example 1, except that the positive hole injection transport layer was formed of the coating solution for forming the positive hole injection transport layer (1) containing scandium acetylacetonate (a scandium complex manufactured by Sigma-Aldrich Corporation) in place of vanadium(III) acetylacetonate.

Comparative Example 1

The organic EL element of Comparative Example 1 was produced in the same manner as Example 1, except that an aromatic solvent, toluene, was used in place of cyclohexanone as the solvent for dissolving the vanadium complex.

Comparative Example 2

The organic EL element of Comparative Example 2 was produced in the same manner as Example 1, except that a thin film of vanadium oxide ($V_2O_5$) (thickness: 5 nm) was produced as the positive hole injection transport layer in place of the vanadium complex thin film.

The vanadium oxide ($V_2O_5$) thin film was formed under vacuum condition (pressure: $1 \times 10^{-4}$ Pa) by a resistance heating vapor deposition method.

Comparative Example 3

The organic EL element of Comparative Example 3 was produced in the same manner as Example 1, except that the positive hole injection transport layer was formed of the coating solution for forming the positive hole injection transport layer (1) containing cobalt(III) acetylacetonate (a cobalt complex manufactured by Sigma-Aldrich Corporation) in place of vanadium(III) acetylacetonate.

Comparative Example 4

The organic EL element of Comparative Example 4 was produced in the same manner as Example 1, except that the positive hole injection transport layer was formed of the coating solution for forming the positive hole injection transport layer (1) containing nickel(II) acetylacetonate (a nickel complex manufactured by Sigma-Aldrich Corporation) in place of vanadium(III) acetylacetonate.

Comparative Example 5

The organic EL element of Comparative Example 5 was produced in the same manner as Example 1, except that the positive hole injection transport layer was formed of the coating solution for forming the positive hole injection transport layer (1) containing copper(II) acetylacetonate (a copper complex manufactured by Sigma-Aldrich Corporation) in place of vanadium(III) acetylacetonate.

Comparative Example 6

The organic EL element of Comparative Example 6 was produced in the same manner as Example 1, except that the positive hole injection transport layer was formed of the coating solution for forming the positive hole injection transport layer (1) containing iron(II) acetylacetonate (an iron complex manufactured by Sigma-Aldrich Corporation) in place of vanadium(III) acetylacetonate.

Comparative Example 7

The organic EL element of Comparative Example 7 was produced in the same manner as Example 1, except that the positive hole injection transport layer was formed of the coating solution for forming the positive hole injection transport layer (1) containing zinc acetylacetonate (a zinc complex manufactured by Sigma-Aldrich Corporation) in place of vanadium(III) acetylacetonate.

Comparative Example 8

The organic EL element of Comparative Example 8 was produced in the same manner as Example 1, except that the positive hole injection transport layer was formed of the coating solution for forming the positive hole injection transport layer (1) containing chromium(III) acetylacetonate (a chromium complex manufactured by Sigma-Aldrich Corporation) in place of vanadium(III) acetylacetonate.

Comparative Example 9

The organic EL element of Comparative Example 9 was produced in the same manner as Example 1, except that the positive hole injection transport layer was formed of the coating solution for forming the positive hole injection transport layer (1) containing titanium isopropoxide (a titanium complex manufactured by Sigma-Aldrich Corporation) in place of vanadium (III) acetylacetonate.

Comparative Example 10

The organic EL element of Comparative Example 10 was produced in the same manner as Example 1, except that the positive hole injection transport layer was formed of the coating solution for forming the positive hole injection transport layer (1) containing manganese (III) acetylacetonate (a manganese complex manufactured by Sigma-Aldrich Corporation) in place of vanadium (III) acetylacetonate.

<Measurement of Cyclohexanone Solution by NMR>

$^1$H-NMR measurement and $^{13}$C-NMR measurement were carried out to see the state of the transition metal complex in cyclohexanone. Each of the coating solutions for forming the positive hole injection transport layer used in Examples 1 to 4, Reference Example 1 and Comparative Examples 1 and 3 to 10 was diluted fourfold with deuterated chloroform and measured with a nuclear magnetic resonator (JNU-LA400W 400 MHz manufactured by JEOL Ltd.)

Spectra were obtained by $^1$H-NMR measurement of the solutions of Examples 1 to 4 and Reference Example 1, which suggest that in the ranges of 1.5 to 1.7 ppm and 2.0 to 2.2 ppm, the C=O bond of cyclohexanone was reduced to form alcohol or an oligomer or polymer, which is not usually observed in cyclohexanone and transition metal complexes. In the ranges, a peak which is assigned to the cyclohexanone solvent and appears at 1.7 to 2.2 ppm was determined as 100, and a peak amount in the range of 1.5 to 1.7 ppm in this case was obtained and is shown in Table 1. As a result, it is suggested that a relatively large amount of reaction products consisting of organic-inorganic composites were formed in Examples 1 to 4 and Reference Example 1, while almost no reaction products consisting of organic-inorganic composites were formed in Comparative Examples 3 to 10. According to the results obtained from $^{13}$C-NMR measurement of the solutions of Examples 1 to 4 and Reference Example 1, it is clear that a spectrum assigned to the original transition metal complex disappeared from any of the samples. On the other hand, a spectrum was obtained from the vanadium complex dissolved in toluene of Comparative Example 1, which shows that the vanadium complex was dissolved, without being decomposed.

<Measurement of HOMO (Work Function)>

HOMO (work function) of the organic-inorganic composite thin film formed from the vanadium complex of Example 1, that of the vanadium complex thin film obtained in Comparative Example 1 and that of the vanadium oxide ($V_2O_5$) thin film used in Comparative Example 2 were measured by means of a photoelectron spectroscopy measurement apparatus (product name: AC-1; manufactured by RIKEN KEIKI Co., Ltd.) HOMO of the organic-inorganic composite thin film obtained from the vanadium complex, was 5.2 eV. HOMO of the vanadium complex was 5.0 eV. Homo of the vanadium oxide was 5.4 eV.

<XPS Measurement of Valence of Vanadium>

The valence of the organic-inorganic composite thin film formed from the vanadium complex of Example 1, that of the vanadium complex thin film obtained in Comparative Example 1 and that of the vanadium oxide ($V_2O_5$) thin film used in Comparative Example 2 were measured by X-ray photoelectron spectroscopy. ESCA-3400 manufactured by Kratos Analytical Limited was used for the measurement. MgKα ray was used as the X-ray source in the measurement. The measurement was performed in the condition of an accelerating voltage of 10 kV and a filament current of 20 mA, without using a monochromator.

A spectrum was obtained from the thin film of Comparative Example 2, which is assigned to 2p3/2 of vanadium having an oxidation number of +5, that is, $V_2O_5$ (peak position: 517 eV).

A spectrum was obtained in Example 1, which has a peak position at 517 eV and a peak around 516 eV on a shoulder. This result indicates a possibility that a composite of vanadium having an oxidation number of +5 and vanadium having an oxidation number of +4 was formed. A spectrum was obtained from the thin film of the vanadium complex of Comparative Example 1, which shows that the vanadium has a peak in the range of 514 to 515 eV and thus has an oxidation number of +3. Since this is the same oxidation number as that of the vanadium complex which is a starting material (+3), it is suggested that a reaction product of the vanadium complex was not produced in Comparative Example 1.

The organic EL elements produced in the above Examples and Comparative Examples emitted green light derived from Ir(mppy)$_3$. The emission luminance and spectrum of these elements were measured by driving spectroradiometer SR-2 manufactured by Topcon Corporation at 10 mA/cm$^2$. The measured results are shown in Table 1. The electric current efficiency was obtained by calculation from drive current and luminance.

The lifetime property of the organic EL element was evaluated by observing luminance which was gradually decreasing over time in a constant current driving. Herein, time (hr.) until the retention of luminance decreases to 50% with respect to the initial luminance of 2,000 cd/m$^2$ was determined as a lifetime (LT 50).

TABLE 1

|  | Positive hole injection transport layer | NMR peak ratio (%) | Applied voltage (V)*[1] | Electric current efficiency (Cd/A) | Elapsed time (hr) LT50*[2] |
| --- | --- | --- | --- | --- | --- |
| Example 1 | V(III) acetylacetonate + Cyclohexanone | 5.1 | 5.8 | 10.5 | 14 |
| Example 2 | Pentacarbonylchlororhenium(I) + Cyclohexanone | 6.5 | 6.02 | 10.9 | 15 |
| Example 3 | Pt(II) acetylacetonate + Cyclohexanone | 3.2 | 9.5 | 6.1 | 8 |
| Example 4 | Pentacarbonylchlororhenium(I) + Molybdenum hexacarbonyl + Cyclohexanone | 6.3 | 5.5 | 10.9 | 17 |
| Comparative Example 1 | V(III) acetylacetonate + Toluene | — | 14.1 | <0.1 | <1 |
| Comparative Example 2 | Vanadium oxide deposited film | — | 6.2 | 9.8 | <1 |
| Comparative Example 3 | Co(III) acetylacetonate + Cyclohexanone | <0.1 | 10.6 | 0.5 | <1 |
| Comparative Example 4 | Ni(II) acetylacetonate + Cyclohexanone | <0.1 | 10.5 | 0.5 | <1 |

TABLE 1-continued

|  | Positive hole injection transport layer | NMR peak ratio (%) | Applied voltage (V)[1] | Electric current efficiency (Cd/A) | Elapsed time (hr) LT50[2] |
|---|---|---|---|---|---|
| Comparative Example 5 | Cu(II) acetylacetonate + Cyclohexanone | <0.1 | 10.8 | 0.4 | <1 |
| Comparative Example 6 | Fe(II) acetylacetonate + Cyclohexanone | 0.6 | 10.5 | <0.1 | <1 |
| Comparative Example 7 | Zn acetylacetonate + Cyclohexanone | <0.1 | 10.6 | <0.1 | <1 |
| Comparative Example 8 | Cr(III) acetylacetonate + Cyclohexanone | 0.3 | 10.7 | <0.1 | <1 |
| Comparative Example 9 | Titanium isopropoxide + Cyclohexanone | <0.1 | 13.8 | <0.1 | <1 |
| Comparative Example 10 | Mn(III) acetylacetonate + Cyclohexanone | 0.3 | 11.1 | 1.9 | 1 |
| Reference Example 1 | Sc acetylacetonate + Cyclohexanone | 4.2 | 10.5 | 5.3 | 5 |

[1]Applied voltage upon driving at 10 mA/cm$^2$
[2]Elapsed time starting from the initial luminance of 2,000 cd/m$^2$ until the retention reaches 50% in a constant current driving.

<Results>

According to the NMR measurement results of the coating solutions for forming the positive hole injection transport layer of Examples 1 to 4, in any of the examples, the peak amount in the range of 1.5 to 1.7 ppm was as large as 3% or more of the base peak and it is indicated that the transition metal complexes highly and actively reacted with cyclohexanone to form organic-inorganic complexes. In Examples 1 too, as shown below, excellent properties were obtained in element properties. Also in Reference Example 1, the peak amount in the range of 1.5 to 1.7 ppm was as large as 3% or more of the base peak and relatively excellent properties were obtained in element properties.

Comparing Example 1 with Comparative Example 1, the element comprising the positive hole injection transport layer of Example 1, which was obtained from the reaction product of the vanadium complex, has a much lower driving voltage, a longer lifetime and more excellent element properties than the element comprising the positive hole injection transport layer of Comparative Example 1, which was obtained by applying the vanadium complex. This result shows that the organic-inorganic composite obtained in the present invention was changed into a substance which is different from the vanadium complex and thus a positive hole injection transport layer with excellent positive hole injection property and excellent driving stability was formed.

Comparing Example 1 with Comparative Example 2, the element comprising the positive hole injection transport layer of Example 1, which was obtained from the reaction product of the vanadium complex, has a lower driving voltage, a longer lifetime and more excellent element properties than the element comprising the positive hole injection transport layer of Comparative Example 2, which is a deposited film of the vanadium oxide. This results shows that the positive hole injection transport layer which is the organic-inorganic composite obtained in the present invention, has more excellent positive hole injection property and more excellent driving stability than the deposited film of the vanadium oxide.

All of the elements of Examples 1 to 4 had excellent properties, each of the elements containing the positive hole injection transport layer in which a reaction product was formed by using the transition metal complex or complexes containing at least one or more kinds of transition metals selected from the group consisting of vanadium, rhenium and platinum or a mixture of rhenium and molybdenum as a central metal or metals.

In Examples 1 to 4, because of using the above-specified, highly-reactive transition metal complex, as suggested by the results of NMR measurement, it is presumed that a relatively large amount of reaction products consisting of organic-inorganic composites were formed.

Poor properties were obtained in the elements of Comparative Examples 1 and 3 to 10, each of which was produced by using the coating solution for forming the positive hole injection transport layer, in which solution it is suggested that no or almost no reaction product consisting of an organic-inorganic composite is formed. In the elements of Comparative Examples 1 and 3 to 10, it is presumed that no or almost no reaction products of organic-inorganic composites are formed.

Comparing Examples 1 to 4 with Comparative Examples 1 and 3 to 10, it is suggested that the formation of reaction products consisting of organic-inorganic composites has an influence on element properties.

REFERENCE SIGNS LIST

1. Electrode
2. Positive hole injection transport layer
3. Organic layer
4a. Positive hole transport layer
4b. Positive hole injection layer
5. Light emitting layer
6. Electrode
7. Substrate
8. Organic semiconductor layer
9. Electrode
10. Insulating layer

The invention claimed is:

1. A device comprising a substrate, two or more electrodes facing each other disposed on the substrate and a positive hole injection transport layer disposed between two electrodes among the two or more electrodes,
    wherein the positive hole injection transport layer contains a reaction product of a transition metal complex or complexes, and
    wherein at least one or more kinds of transition metals selected from the group consisting of vanadium, rhenium and platinum, or a mixture of molybdenum and one or more kinds of transition metals selected from the group consisting of vanadium, rhenium and platinum is contained in a central metal or metals of the transition metal complex or complexes; and wherein the reaction product of the transition metal complex or complexes is an organic-inorganic composite different from a hydrolysate, is a redox reaction product of a transition metal complex with an organic solvent having a carbonyl group and/or hydroxyl group, and also contains a transition metal oxide or oxides.

2. The device according to claim 1, wherein the positive hole injection transport layer contains at least the reaction product of the transition metal complex or complexes and a positive hole transport compound.

3. The device according to claim 1, wherein the positive hole injection transport layer comprises a layer in which at least a layer containing the reaction product of the transition metal complex or complexes and a layer containing the positive hole transport compound are laminated.

4. The device according to claim 1, wherein the positive hole injection transport layer comprises a layer in which at least a layer containing the reaction product of the transition metal complex or complexes and a layer at least containing the reaction product of the transition metal complex or complexes and the positive hole transport compound are laminated.

5. The device according to claim 2, wherein the positive hole transport compound is a positive hole transport polymer compound.

6. The device according to claim 1, wherein the device is an organic EL element containing an organic layer at least having a light emitting layer.

7. A method for producing a device comprising a substrate, two or more electrodes facing each other disposed on the substrate and a positive hole injection transport layer disposed between two electrodes among the two or more electrodes, the method comprising:

a preparation step of preparing an ink for forming the positive hole injection transport layer, containing an organic solvent having a carbonyl group and/or hydroxyl group and a transition metal complex or complexes in which at least one or more kinds of transition metals selected from the group consisting of vanadium, rhenium and platinum or a mixture of molybdenum and one or more kinds of transition metals selected from the group consisting of vanadium, rhenium and platinum is contained in a central metal or metals of the transition metal complex or complexes;

a formation step of forming the positive hole injection transport layer on any of layers on the electrodes using the ink for forming the positive hole injection transport layer; and an oxidation step of at least partially oxidizing the transition metal complex or complexes to produce a transition metal oxide or oxides, wherein the positive hole injection transport layer contains a reaction product of the transition metal complex or complexes, and wherein at least one or more kinds of transition metals selected from the group consisting of vanadium, rhenium and platinum, or a mixture of molybdenum and one or more kinds of transition metals selected from the group consisting of vanadium, rhenium and platinum is contained in a central metal or metals of the transition metal complex or complexes; and wherein the reaction product of the transition metal complex or complexes is an organic-inorganic composite different from a hydrolysate, is a redox reaction product of a transition metal complex with an organic solvent having a carbonyl group and/or hydroxyl group, and also contains a transition metal oxide or oxides.

8. The method for producing the device according to claim 7 comprising:

the formation step of forming the positive hole injection transport layer containing the transition metal complex or complexes on any of the layers on the electrodes; and the oxidation step of at least partially oxidizing the transition metal complex or complexes in the positive hole injection transport layer to produce the transition metal oxide or oxides.

9. The method for producing the device according to claim 7, wherein the oxidation step is performed after preparing the ink for forming the positive hole injection transport layer before forming the positive hole injection transport layer so that the formation step is forming the positive hole injection transport layer containing the transition metal oxide or oxides on any of layers on the electrodes using the oxidized ink for forming the positive hole injection transport layer.

10. The method for producing the device according to claim 7, wherein the oxidation step includes a heating process.

11. The method for producing the device according to claim 7, wherein the oxidation step includes a light irradiation process.

12. The method for producing the device according to claim 7, wherein the oxidation step includes a process of using active oxygen.

* * * * *